(12) United States Patent
Yang

(10) Patent No.: US 10,068,950 B2
(45) Date of Patent: Sep. 4, 2018

(54) PIXEL CIRCUIT, DRIVING METHOD THEREOF, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 185 days.

(21) Appl. No.: 14/775,006

(22) PCT Filed: Oct. 11, 2014

(86) PCT No.: PCT/CN2014/088407
§ 371 (c)(1),
(2) Date: Sep. 11, 2015

(87) PCT Pub. No.: WO2016/011707
PCT Pub. Date: Jan. 28, 2016

(65) Prior Publication Data
US 2016/0204165 A1 Jul. 14, 2016

(30) Foreign Application Priority Data
Jul. 21, 2014 (CN) .......................... 2014 1 0347992

(51) Int. Cl.
G06F 3/045 (2006.01)
H01L 27/32 (2006.01)
(Continued)

(52) U.S. Cl.
CPC ............ *H01L 27/323* (2013.01); *G06F 3/042* (2013.01); *G06F 3/044* (2013.01); *G09G 3/3225* (2013.01);
(Continued)

(58) Field of Classification Search
CPC ....... H01L 27/323; G06F 3/042; G06F 3/044; G09G 3/3225; G09G 3/3258;
(Continued)

(56) References Cited

U.S. PATENT DOCUMENTS 8,581,811 B2 11/2013 Lee et al.
2003/0107560 A1 6/2003 Yumoto et al.
(Continued)

FOREIGN PATENT DOCUMENTS

CN 1455914 A 11/2003
CN 1567416 A 1/2005
(Continued)

OTHER PUBLICATIONS

Second Chinese Office Action dated Jun. 24, 2016; Appln. No. 201410347992.5.
(Continued)

*Primary Examiner* — Mark Regn
(74) *Attorney, Agent, or Firm* — Ladas & Parry LLP

(57) ABSTRACT

A pixel circuit, a driving method thereof and a display apparatus, the pixel circuit comprises a data voltage writing module (100), two driving modules and two light emitting modules; wherein the data voltage writing module (100) is connected with a data voltage line (Vdata), a writing control line (R) and the two driving modules, and is configured to write a first data voltage on the data voltage line (Vdata) to a first driving module (210) at first and then write a second data voltage to a second driving module (220) according to inputs from the writing control line (R); the first driving (Continued)

module (210) is connected with a first light emitting module (310), the second driving module (220) is connected with a second light emitting module (320); and both of the two driving modules are connected with an operating voltage line (Vdd) and a driving control line (S), and are configured to drive the corresponding light emitting module to emit light under the control of the driving control line (S). By utilizing one circuit to realize the driving of two pixels, two adjacent pixels shares several signal lines, the number of the signal lines for the pixel circuit in the display apparatus can be decreased, the cost of the integrated circuit is reduced, a pixel pitch is decreased, and a pixel density is increased.

20 Claims, 23 Drawing Sheets

(51) Int. Cl.
*G06F 3/042* (2006.01)
*G06F 3/044* (2006.01)
*G09G 3/3258* (2016.01)
*G09G 3/3225* (2016.01)

(52) U.S. Cl.
CPC ... *G09G 3/3258* (2013.01); *G09G 2300/0426* (2013.01); *G09G 2300/0814* (2013.01); *G09G 2300/0819* (2013.01); *G09G 2300/0842* (2013.01); *G09G 2300/0861* (2013.01); *G09G 2310/0251* (2013.01); *G09G 2310/0297* (2013.01); *G09G 2310/061* (2013.01); *G09G 2310/08* (2013.01); *G09G 2320/0233* (2013.01); *G09G 2320/0626* (2013.01); *G09G 2330/021* (2013.01)

(58) Field of Classification Search
CPC ... G09G 2300/0426; G09G 2300/0814; G09G 2300/0819; G09G 2300/0842; G09G 2300/0861; G09G 230/0251; G09G 230/0297; G09G 230/061; G09G 230/08; G09G 2330/021
USPC ........................................................ 345/174
See application file for complete search history.

(56) References Cited

U.S. PATENT DOCUMENTS

| | | | |
|---|---|---|---|
| 2005/0104817 A1 | 5/2005 | Kwak | |
| 2005/0104818 A1* | 5/2005 | Kwak | G09G 3/3233 345/76 |
| 2005/0110723 A1 | 5/2005 | Shin | |
| 2007/0086078 A1* | 4/2007 | Hagood | G09G 3/3433 359/298 |
| 2009/0207104 A1 | 8/2009 | Lee | |
| 2011/0221789 A1* | 9/2011 | Ota | G09G 3/3266 345/690 |
| 2013/0249955 A1* | 9/2013 | Kim | G09G 3/3233 345/690 |
| 2015/0221255 A1 | 8/2015 | Qing et al. | |
| 2016/0041676 A1 | 2/2016 | Tan et al. | |

FOREIGN PATENT DOCUMENTS

| | | | |
|---|---|---|---|
| CN | 1617205 A | | 5/2005 |
| CN | 1617208 A | | 5/2005 |
| CN | 1622723 A | | 6/2005 |
| CN | 102194407 A | | 9/2011 |
| CN | 102290027 A | | 12/2011 |
| CN | 103208255 A | | 7/2013 |
| CN | 103310734 A | | 9/2013 |
| CN | 203480810 | * | 9/2013 |
| CN | 203480810 A | | 3/2014 |
| CN | 103700345 A | | 4/2014 |

OTHER PUBLICATIONS

The Fourth Chinese Office Action dated May 26, 2017; Appln. No. 201410347992.5.
Third Chinese Office Action dated Dec. 16, 2016; Appln. No. 201410347992.5.
International Search Report and Written Opinion dated Apr. 28, 2015; PCT/CN2014/088407.
First Chinese Office Action dated Nov. 18, 2015; Appln. No. 201410347992.5.

* cited by examiner

PIXEL CIRCUIT, DRIVING METHOD THEREOF, AND DISPLAY APPARATUS

TECHNICAL FIELD

The present disclosure relates to a pixel circuit, a driving method thereof and a display apparatus.

BACKGROUND

An Organic Light Emitting Diode (OLED) has attracted the most attention in a research field for a flat panel display recently. As compared with a liquid crystal display, the OLED has advantages of low power consumption, low manufacture cost, self-illumination, wide angle of view, rapid response speed, etc. Currently, the OLED has replaced a traditional Liquid Crystal Display (LCD) screen gradually in the display field such as mobile phone, PDA, digital camera and the like. A design of a pixel driving circuit is a core technique in an OLED display and has fatal research significance.

Unlike a Thin Film Transistor (TFT)-LCD which controls its brightness with a stable voltage, the OLED is driven by current and needs a stable current to control the light emitting.

Because of processes and aging of devices or other reasons, in an existing 2T1C driving circuit (comprising two thin film transistors and one capacitor), threshold voltages of driving TFTs at respective pixel points are not uniform, which causes variances in the currents flowing through the OLEDs of corresponding pixel points and in turn leads to a non-uniformity in the display brightness, such that a display effect of an entire image is affected.

Generally, one pixel circuit usually corresponds to one pixel, each pixel circuit at least comprises one data voltage line, one operating voltage line and a plurality of scan signal lines, such that a corresponding manufacture process is complex, which is disadvantageous for reducing a pixel pitch.

SUMMARY

At least one of embodiments of the present disclosure avoids a problem of non-uniformity in display brightness of a display apparatus, and decreases a number of signal lines for a pixel circuit in the display apparatus, which reduces the cost of integrated circuits and increases the pixel density of the display apparatus meanwhile.

At least one of the embodiments of the present disclosure provides a pixel circuit, comprising a data voltage writing module, two driving modules and two light emitting modules; wherein the data voltage writing module is connected with a data voltage line, a writing control line and the two driving modules, and is configured to write a first data voltage on the data voltage line to a first driving module at first and then write a second data voltage on the data voltage line to a second driving module in a same frame according to inputs from the writing control line; the first driving module is connected with a first light emitting module, the second driving module is connected with a second light emitting module; and both of the two driving modules are connected with an operating voltage line and a driving control line, and are configured to drive the corresponding light emitting module to emit light under the control of the driving control line.

Optionally, the data voltage writing module comprises a first sub-data voltage writing module and a second sub-data voltage writing module, the first sub-data voltage writing module is connected with the data voltage line, a first writing control line and the first driving module, and the second sub-data voltage writing module is connected with the data voltage line, a second writing control line and the second driving module.

Optionally, each of the sub-data voltage writing modules comprises a writing transistor, a gate of the writing transistor is connected with the corresponding writing control line, a source of the writing transistor is connected with the data voltage line, and a drain of the writing transistor is connected with the corresponding driving module.

Optionally, each of the driving modules comprises three driving transistors and a storage capacitor, wherein a source of a first driving transistor is connected with the drain of the corresponding writing transistor, a gate and a drain of the first driving transistor are connected with a gate of a second driving transistor; a drain of the second driving transistor is connected with a source of a third driving transistor, a source of the second driving transistor is connected with the data voltage line; a gate of the third driving transistor is connected with the driving control line, a drain of the third driving transistor is connected with the light emitting module; a first terminal of the storage capacitor is connected with the gate of the second driving transistor, and a second terminal of the storage capacitor is connected with the source of the second driving transistor.

Optionally, it further comprises a first reset transistor and a second reset transistor, a gate of the first reset transistor is connected with a reset control line, a source of the first reset transistor is connected with the first terminal of the storage capacitor in the first driving module, a drain of the first reset transistor is connected with a reset low voltage level line; a gate of the second reset transistor is connected with the reset control line, a source of the second reset transistor is connected with the first terminal of the storage capacitor in the second driving module, a drain of the second reset transistor is connected with the reset low voltage level line.

Optionally, each of the driving modules comprises four driving transistors and a storage capacitor; wherein a gate of a first driving transistor is connected with the driving control line, a source of the first driving transistor is connected with an operating voltage line, a drain of the first driving transistor is connected with a source of a second driving transistor; a gate of the second driving transistor is connected with a first terminal of the storage capacitor, a drain of the second driving transistor is connected with a source of a third driving transistor; a gate of the third driving transistor is connected with the driving control line, a drain of the third driving transistor is connected with the light emitting module; a drain of a fourth driving transistor is connected with the drain of the second driving transistor, a source of the fourth driving transistor is connected with the first terminal of the storage capacitor; a second terminal of the storage capacitor is grounded; a gate of the fourth driving transistor in the first driving module is connected with the first writing control line, and a gate of the fourth driving transistor in the second driving module is connected with the second writing control line.

Optionally, it further comprises a first reset transistor and a second reset transistor, gates of both of the reset transistors are connected with a reset control line; a source of the first reset transistor is connected with the first terminal of the storage capacitor in the first driving module, a drain of the first reset transistor is connected with the second terminal of the storage capacitor in the first driving module; a source of the second reset transistor is connected with the first terminal of the storage capacitor in the second driving module, a drain of the second reset transistor is connected with the second terminal of the storage capacitor in the second driving module.

Optionally, it further comprises a capacitive touch detection module and a photo-sensitive touch detection module, the capacitive touch detection module comprises a first touch transistor, a second touch transistor, a third touch transistor, a first sensing capacitor and a touch electrode, a gate of the first touch transistor is connected with the reset control line, a source of the first touch transistor is connected with the data voltage line, a drain of the first touch transistor is connected with a first terminal of the first sensing capacitor; a gate of the second touch transistor is connected with the first terminal of the first sensing capacitor, a source of the second touch transistor is connected with a second terminal of the first sensing capacitor, a drain of the second touch transistor is connected with a source of the third touch transistor; a gate of the third touch transistor is connected with the first writing control line, a drain of the third touch transistor is connected with a touch signal reading line; the second terminal of the first sensing capacitor is further connected with a detect driving voltage line, and the touch electrode is connected with the gate of the second touch transistor.

The photo-sensitive touch detection module comprises a fourth touch transistor, a fifth touch transistor, a sixth touch transistor, a seventh touch transistor and a second sensing capacitor, a gate of the fourth touch transistor is connected with the second writing control line, a source of the fourth touch transistor is connected with the data voltage line, a drain of the fourth touch transistor is connected with a first terminal of the second sensing capacitor; a gate and a drain of the fifth touch transistor are connected with the first terminal of the second sensing capacitor, a source of the fifth touch transistor is connected with a second terminal of the second sensing capacitor; a gate of the sixth touch transistor is connected with the driving control line, a source of the sixth touch transistor is connected with the second terminal of the second sensing capacitor, a drain of the sixth touch transistor is connected with the touch signal reading line; a gate of the seventh touch transistor is connected with the reset control line, a source of the seventh touch transistor is connected with the first terminal of the second sensing capacitor, a drain of the seventh touch transistor is grounded; wherein the fifth touch transistor is a photo-sensitive transistor.

Optionally, each of the driving modules comprises four driving transistors and a storage capacitor, a gate of a first driving transistor is connected with a first driving control line, a source of the first driving transistor is connected with drains of a second driving transistor and a third driving transistor, a drain of the first driving transistor is connected with the operating voltage line; a gate of the second driving transistor is connected with a second driving control line, a source of the second driving transistor is connected with a first terminal of the storage capacitor, a gate of the third driving transistor is connected with the first terminal of the storage capacitor, a source of the third driving transistor is connected with the light emitting module; a gate and a drain of a fourth driving transistor are connected with the first terminal of the storage capacitor, a source of the fourth driving transistor is connected with the corresponding writing transistor; and a second terminal of the storage capacitor is connected with a low voltage level line.

Optionally, the data voltage writing module comprises three writing transistors, wherein a gate of a first writing transistor is connected with a first writing control line, a source of the first writing transistor is connected with the data voltage line, a drain of the first writing transistor is connected with a source of a second writing transistor; a gate of the second writing transistor is connected with the first driving module and a drain of a third writing transistor, a drain of the second writing transistor is connected with a source of the third writing transistor and the second driving module; and a gate of the third writing transistor is connected with a second writing control line.

Optionally, each of the driving modules comprises two driving transistors and a storage capacitor, wherein a source of a first driving transistor is connected with the operating voltage line, a drain of the first driving transistor is connected with a source of a second driving transistor; a gate of the second driving transistor is connected with the driving control line, a source of the second driving transistor is connected with the drain of the first driving transistor, a drain of the second driving transistor is connected with the light emitting module; the storage capacitor is connected between a gate and the source of the first driving transistor; the gate of the first driving transistor in the first driving module is connected with the gate of the second writing transistor, and the gate of the first driving transistor in the second driving module is connected with the drain of the second writing transistor.

Optionally, it further comprises a reset transistor, a gate of the reset transistor is connected with a reset control line, a source of the reset transistor is connected with the drain of the second writing transistor, and a drain of the reset transistor is connected with a reset low voltage level line.

The present disclosure further provides a method for driving any one of the pixel circuits described above, with a process for driving each frame of pixel data be divided into a first charging phase, a second charging phase and a light emitting phase, wherein the method comprises:

in the first charging phase, a first data voltage is applied on the data voltage line, and a first scan voltage is applied on the writing control line so as to write the first data voltage into the first driving module;

in the second charging phase, a second data voltage is applied on the data voltage line, and a second scan voltage is applied on the writing control line so as to write the second data voltage into the second driving module; and in the light emitting phase, a scan voltage is input to the driving control line to make the driving module drive the light emitting module to emit light.

The present disclosure further provides a display apparatus comprising any one of the pixel circuits described above.

In the pixel circuit according to the at least one of the embodiments of the present disclosure, one circuit is utilized to realize the driving of two pixels, two adjacent pixels shares several signal lines, the number of the signal lines for the pixel circuit in the display apparatus can be decreased, the cost of the integrated circuit is reduced, a pixel pitch is decreased, and a pixel density is increased.

DETAILED DESCRIPTION

Figure 1:
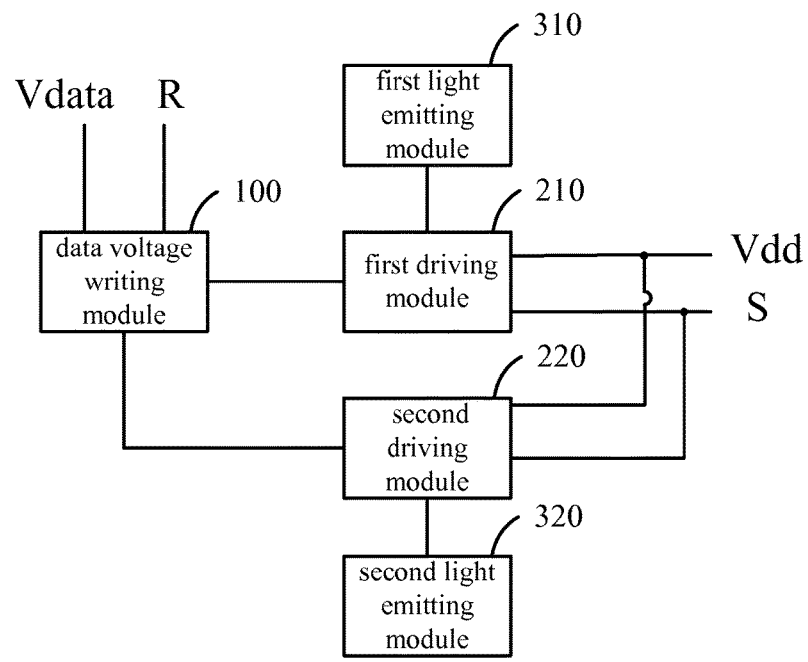
FIG. 1 is an exemplary view illustrating a structure of a pixel circuit provided by an embodiment of the present disclosure.

Thereafter, implementations of the present disclosure will be further described in connection with drawings and embodiments of the present disclosure. Following embodiments are only for more clearly illustrating solutions of the present disclosure instead of limiting a scope of the present disclosure. In drawings, like reference numerals refer to like elements throughout.

FIG. 1 is an exemplary view illustrating a structure of a pixel circuit provided by an embodiment of the present disclosure. As illustrated in FIG. 1, the pixel circuit comprises a data voltage writing module 100, a first driving module 210, a second driving module 220 a first light emitting module 310 and a second light emitting module 320; the data voltage writing module 100 is connected with a data voltage line Vdata, a writing control line R and the two driving modules 210, 220, and is configured to write a first data voltage on the data voltage line Vdata to the first driving module 210 at first and then write a second data voltage on the data voltage line Vdata to the second driving module 220 in a same frame according to inputs from the writing control line R; the first driving module 210 is connected with the first light emitting module 310, the second driving module 220 is connected with the second light emitting module 320; and both of the two driving modules are connected with an operating voltage line Vdd and a driving control line S, and are configured to drive the corresponding light emitting module to emit light under the control of the driving control line S.

In the present disclosure, one circuit is utilized to realize the driving of two pixels, two adjacent pixels shares several signal lines, the number of the signal lines for the pixel circuit in a display apparatus can be decreased, a cost of the integrated circuit is reduced, a pixel pitch is decreased, and a pixel density is increased.

For example, the light emitting module 310 comprises two electroluminescent elements each connected with one driving module.

In the embodiments of the present disclosure, the electroluminescent element may be any one of various current-driven light emitting devices comprising a general LED (Light Emitting Diode) or an OLED (Organic Light Emitting Diode). In the embodiments of the present disclosure, descriptions are made by taking the OLED as an example.

In a method for driving the pixel circuits provided by embodiments of the present disclosure, each frame comprises a first charging phase, a second charging phase and a light emitting phase:

in the first charging phase, a first data voltage is applied on the data voltage line, and a first scan voltage is applied on the writing control line so as to write the first data voltage into the first driving module;

in the second charging phase, a second data voltage is applied on the data voltage line, and a second scan voltage is applied on the writing control line so as to write the second data voltage into the second driving module; and in the light emitting phase, a scan voltage is input to the driving control line to make the driving module drive the light emitting module to emit light.

Figure 2:
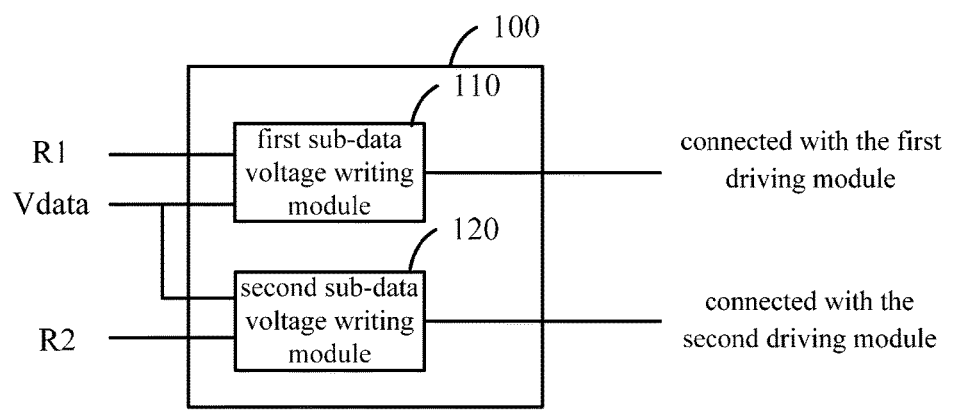
FIG. 2 is an exemplary view illustrating a structure of a data voltage writing module in the pixel circuit provided by the embodiment of the present disclosure.

FIG. 2 is an exemplary view illustrating a structure of a data voltage writing module in the pixel circuit provided by the embodiment of the present disclosure. In the alternative first, second and third embodiments provided by the present disclosure, as shown in FIG. 2, the data voltage writing module 100 comprises a first sub-data voltage writing module 110 and a second sub-data voltage writing module 120, the writing control line R comprises the first writing control line R1 and the second writing control line R2, the first sub-data voltage writing module 110 is connected with the data voltage line Vdata, the first writing control line R1 and the first driving module 210, and the second sub-data voltage writing module 120 is connected with the data voltage line Vdata, the second writing control line R2 and the second driving module 220.

The pixel circuits provided by the first, second and third embodiments of the present disclosure would be described respectively in connection with their circuit structure views.

Figure 3:
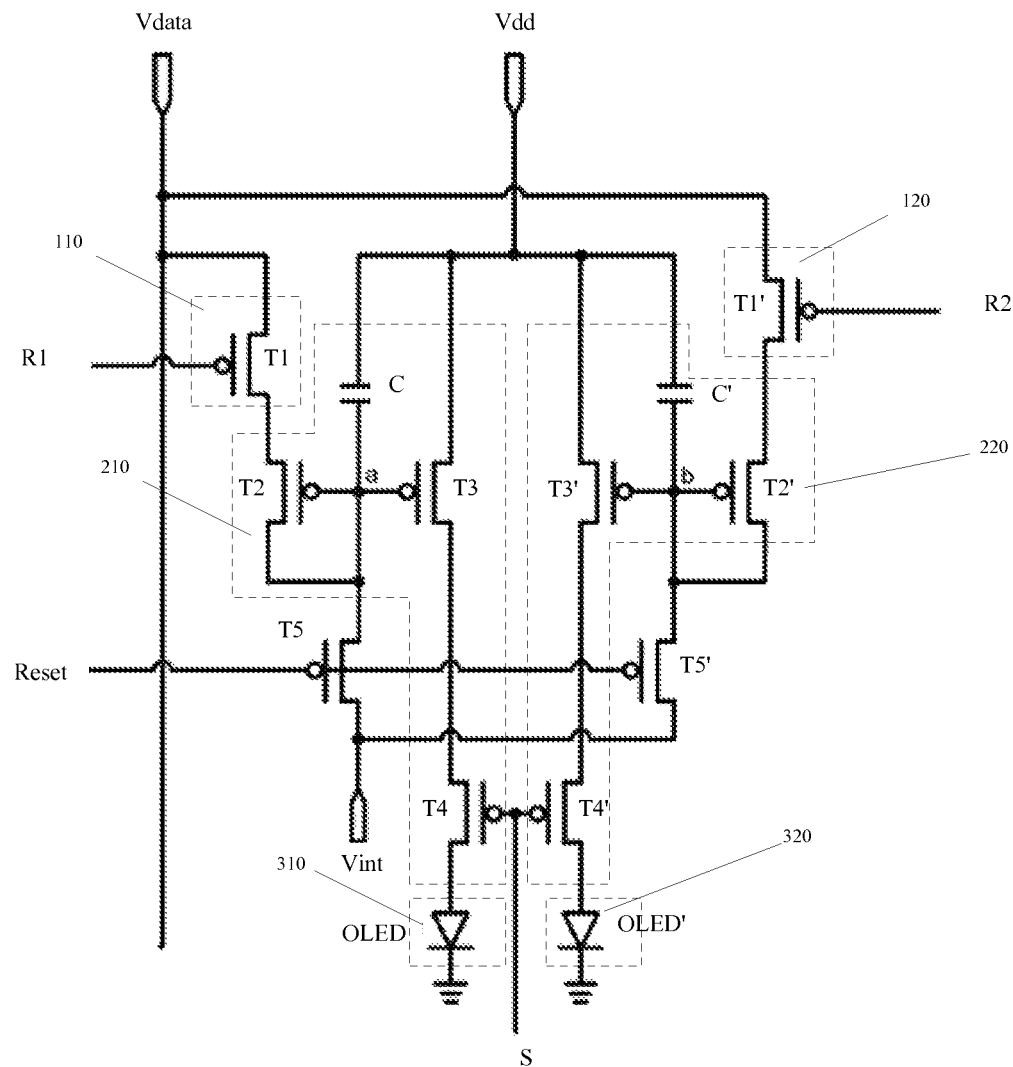
FIG. 3 is an exemplary view illustrating a circuit structure of a pixel circuit provided by a first embodiment of the present disclosure.
Figure 6:
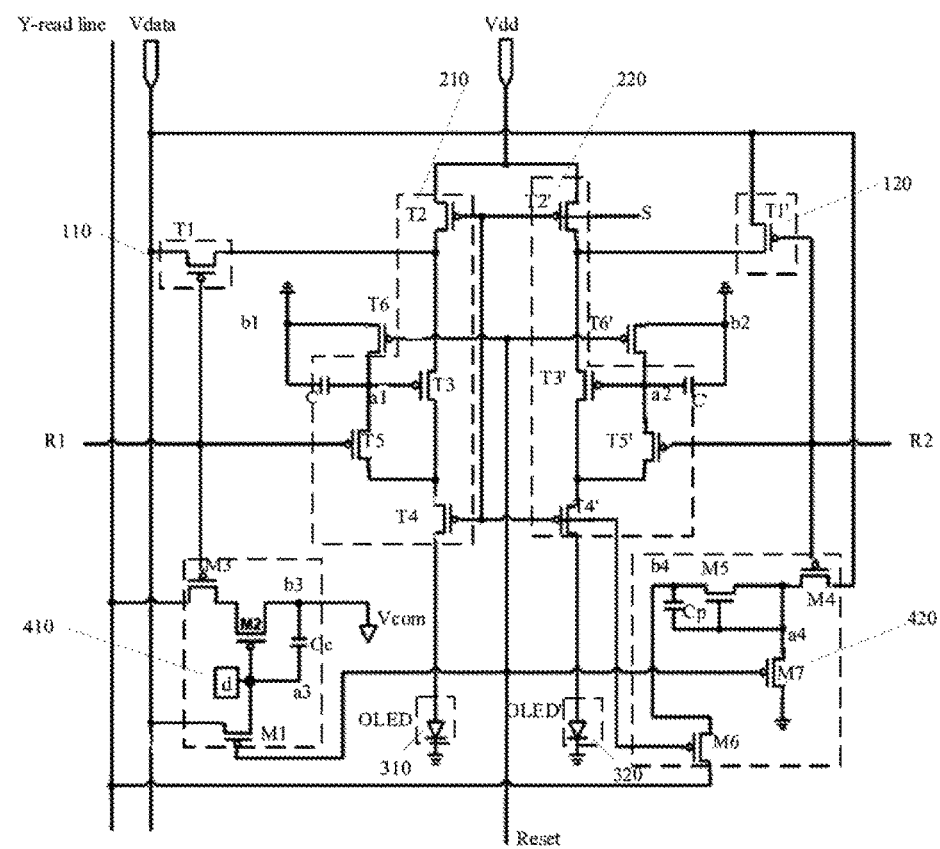
FIG. 6 is an exemplary view illustrating a circuit structure of a pixel circuit provided by a second embodiment of the present disclosure.
Figure 9:
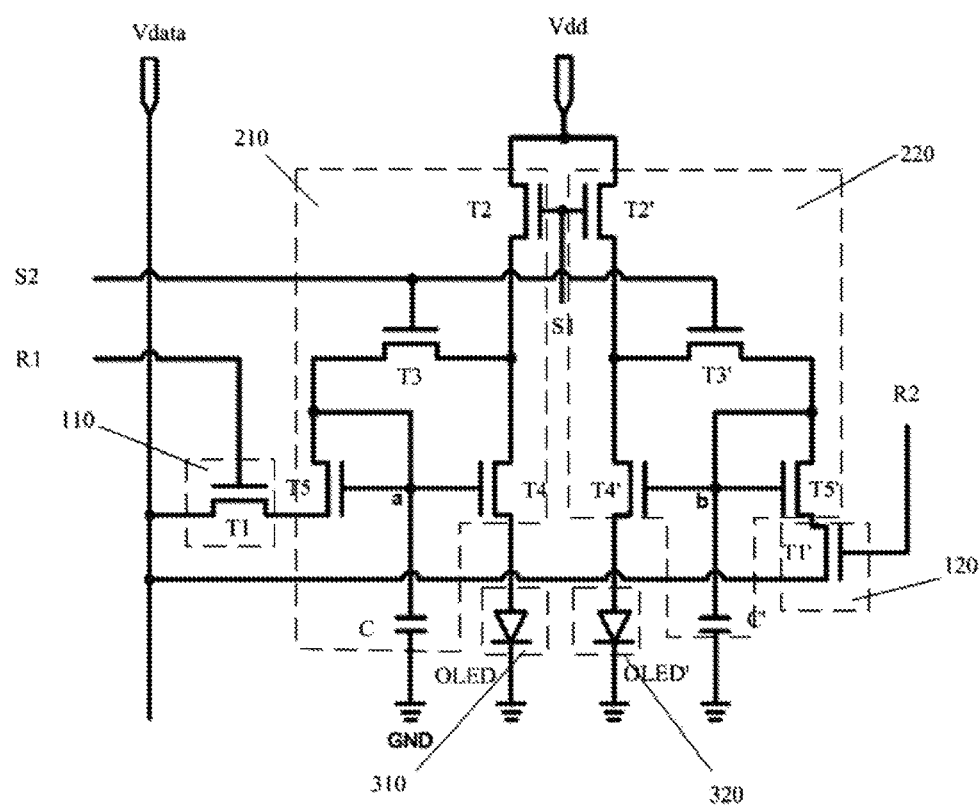
FIG. 9 is an exemplary view illustrating a circuit structure of a pixel circuit provided by a third embodiment of the present disclosure.

FIGS. 3, 6 and 9 are exemplary views illustrating circuit structures of the pixel circuits provided by the first, second and third embodiments of the present disclosure, respectively. In the first embodiment (referring to FIG. 3), the second embodiment (referring to FIG. 6) and the third embodiment (referring to FIG. 9) according to the present disclosure, all of the first sub-data voltage writing modules 110 may comprise a writing transistor T1, a gate of the writing transistor T1 is connected with the first writing control line R1, a source thereof is connected with the data voltage line Vdata, and a drain thereof is connected with the first driving module 210; correspondingly, all of the second sub-data voltage writing modules 120 may comprise a writing transistor T1', a gate of the writing transistor T1' is connected with the second writing control line R2, a source thereof is connected with the data voltage line Vdata, and a drain thereof is connected with the second driving module 220.

Herein, the writing transistor refers to a transistor for controlling the writing.

First Embodiment

As illustrated in FIG. 3, in the pixel circuit provided by the first embodiment of the present disclosure, the structures of the two driving modules are same, so the description would be made by only taking the first driving module 210 as an example thereafter for a purpose of convenience. As illustrated in FIG. 3, the first driving module 210 comprises a first driving transistor T2, a second driving transistor T3, a third driving transistor T4 and a storage capacitor (as for the second driving module 220, its first driving transistor, second driving transistor, third driving transistor and storage capacitor are denoted as T2', T3', T4' and C' sequentially in the drawings). A source of the first driving transistor T2 is connected with the drain of the corresponding writing transistor T1, a gate and a drain the first driving transistor T2 are connected with a gate of the second driving transistor T3; a drain of the second driving transistor T3 is connected with a source of the third driving transistor T4, a source the second driving transistor T3 is connected with the operating voltage line Vdd; a gate of the third driving transistor T4 is connected with the driving control line S, a drain of the third driving transistor T4 is connected with the OLED; a first terminal, namely, a terminal a, of the storage capacitor C (as for the capacitor C', its first terminal is the terminal b) is connected with the gate of the second driving transistor T3, and a second terminal of the storage capacitor C is connected with the source of the second driving transistor T3.

Herein, the driving transistor refers to a transistor involved in the driving module.

In an alternative embodiment of the present disclosure, an operating current flowing through the electroluminescent unit would not be affected by a threshold voltage of the corresponding driving transistor, which completely avoids a problem of non-uniformity in a display brightness caused by drifting of the threshold voltage of the driving transistor. Also, in the embodiments of the present disclosure, two pixel only use three control lines, one operating voltage line and one data voltage line, so the number of signal lines used are decreased greatly, thus a pixel density can be further increased.

Optionally, the pixel circuit provided by the first embodiment further comprises a first reset transistor T5 and a second reset transistor T5', as illustrated in FIG. 3, a gate of the first reset transistor T5 is connected with a reset control line Reset, a source of the first reset transistor T5 is connected with the first terminal of the storage capacitor C in the first driving module 210, a drain of the first reset transistor T5 is connected with a reset low voltage level line Vint (or is grounded); a gate of the second reset transistor T5' is connected with the reset control line Reset, a source of the second reset transistor T5' is connected with the first terminal of the storage capacitor C' in the second driving module 220, a drain of the second reset transistor T5' is connected with the reset low voltage level line Vint. It can be understood that a voltage input into the reset low voltage level line may be a negative voltage or a zero voltage (which is equivalent to a case where the drain of the reset transistor is grounded).

Herein, the reset transistor in the present specification refers to a transistor for controlling the driving transistor to be reset.

An initialization of the driving module may be realized rapidly and completely by setting the reset transistor so as to reset voltages at the capacitors in the driving module.

Optionally, the transistors involved in the first embodiment of present disclosure (comprising the writing transistors, the driving transistors and the reset transistors) are all P channel TFTs (Thin Film Transistors).

Utilizing of the transistors with the same type can realize uniformity in process and improve product yield. Those skilled in the art can understand that the types of the transistors may not be exactly the same in actual application, for example, the T5 and T5' may be N channel transistors, while the T4 and T4' may be P channel transistors, and the solution according to the present disclosure can be implemented as long as the two transistors whose control terminals are connected to the same scan signal line have same turn-on/off states. Alternative implementations of the present disclosure would not be constructed as limitations on the scope sought for protection by the present disclosure.

Figure 4:
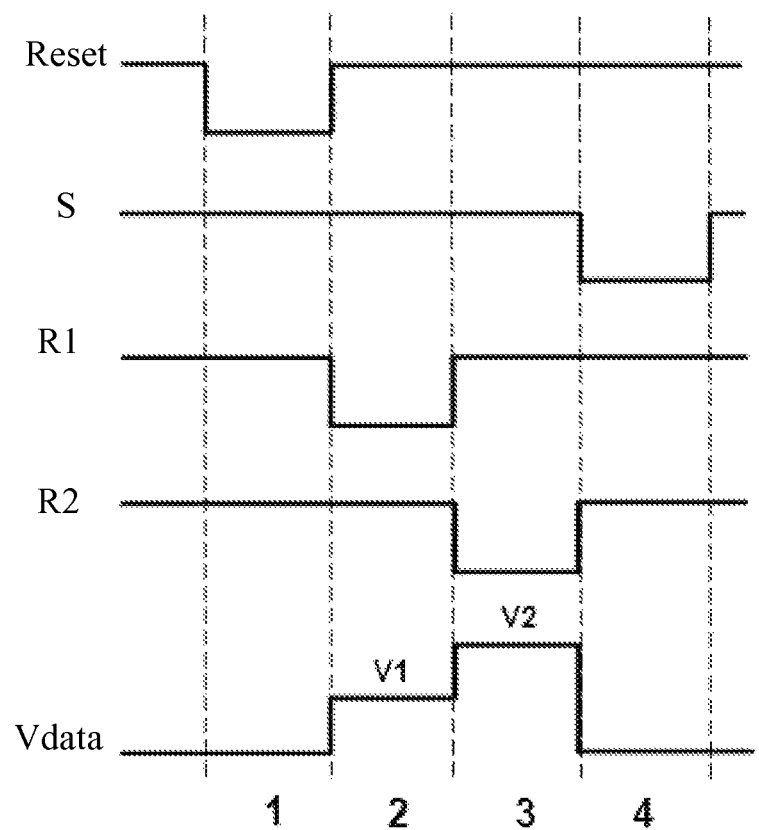
FIG. 4 is a timing chart of key signals in a method for driving the pixel circuit provided by the first embodiment of the present disclosure.
Figure 5A:
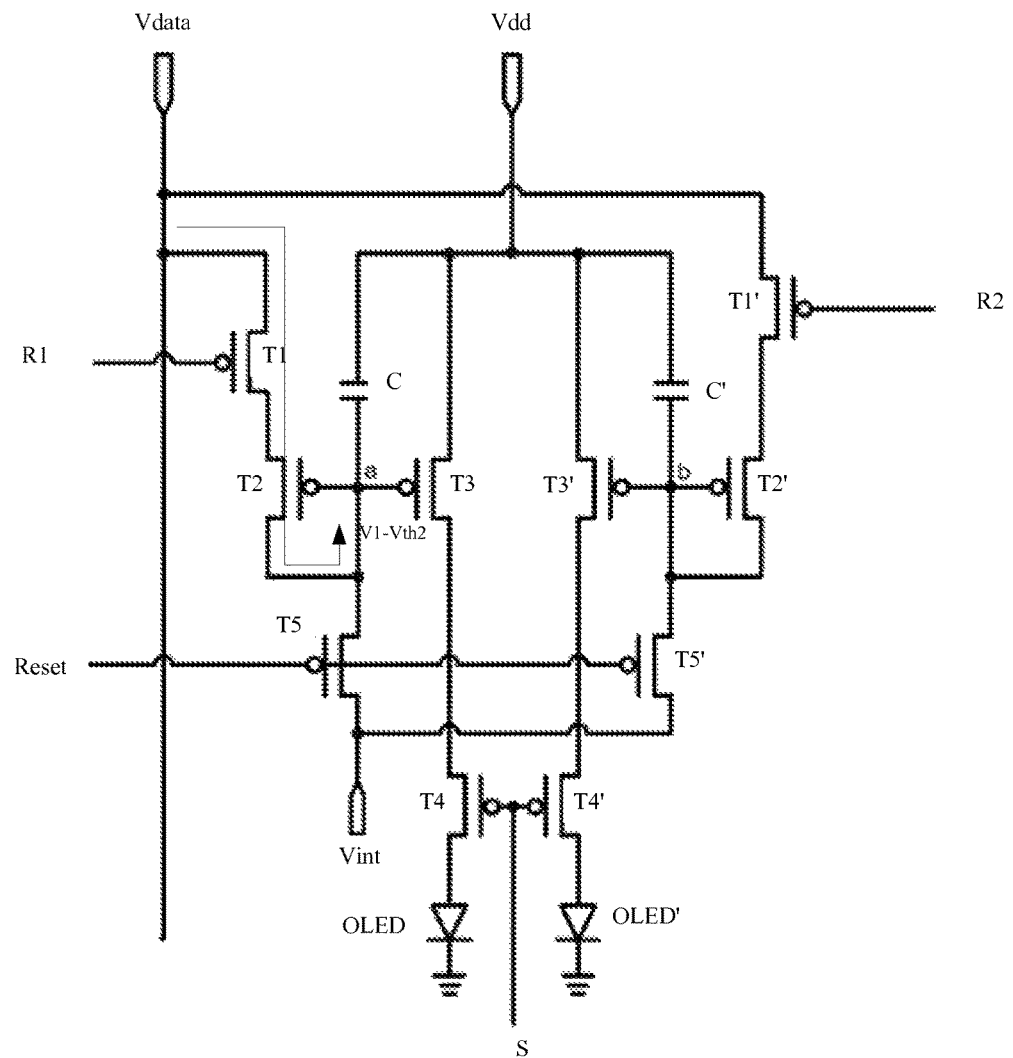
FIGS. 5a-5c are exemplary views illustrating current flows and voltage values of the pixel circuit under different timings according to the first embodiment of the present disclosure.
Figure 5B:
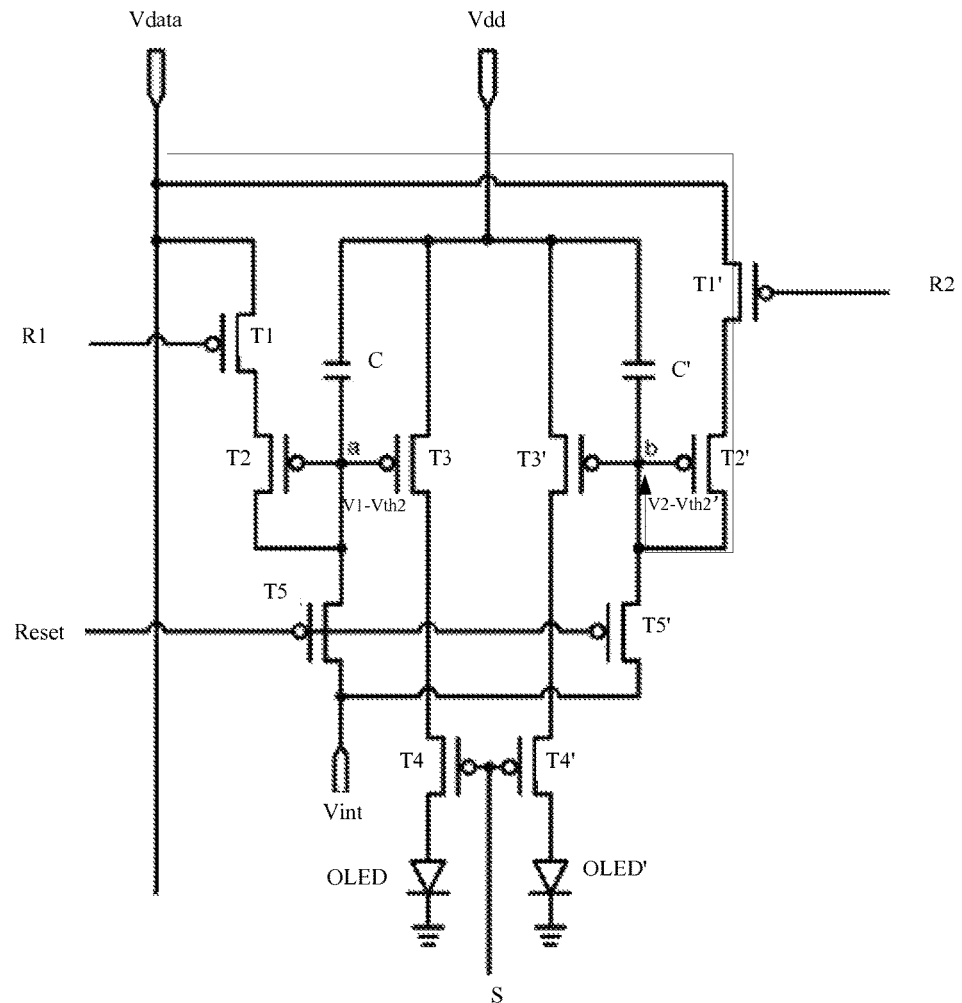
Figure 5C:
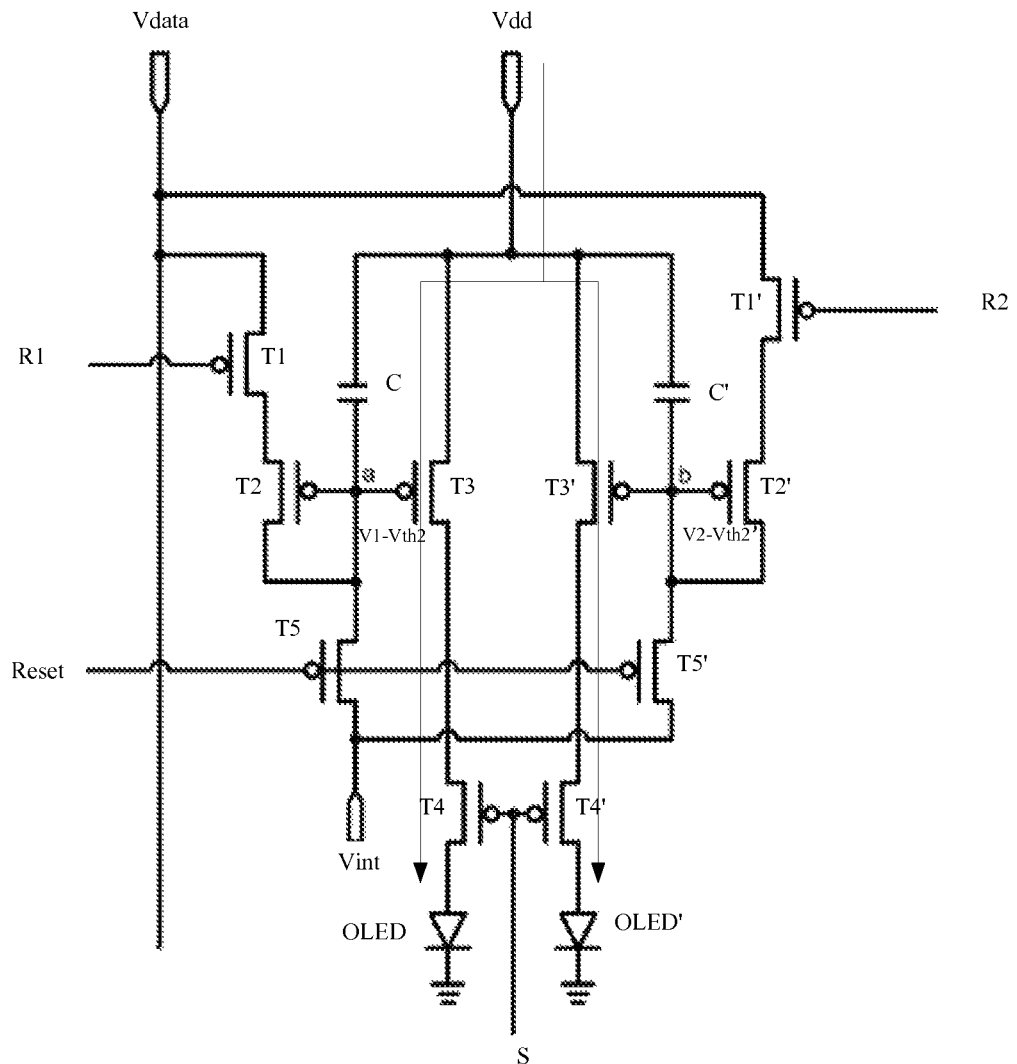

An alternative method for driving the pixel circuit provided by the first embodiment of the present disclosure will be described thereafter in connection with FIGS. 4 and 5. FIG. 4 is a timing chart of key signals in the method for driving the pixel circuit provided by the first embodiment of the present disclosure. As illustrated in FIG. 4, the process for driving each frame of pixel data may be divided into a first charging phase 2, a second charging phase 3 and a light emitting phase 4. FIGS. 5a-5c are exemplary views illustrating current flows and voltage values of the pixel circuit under different timings according to the first embodiment of the present disclosure. The current flows and voltage values of the pixel circuit in the respective phases 2-4 described above are as illustrated in FIGS. 5a, 5b, 5c, respectively.

In the first charging phase 2, a first data voltage V1 required by the OLED to emit light during this frame is applied on the data voltage line Vdata, a low voltage level is applied on the first writing control line R1 in order to turn on the T1 and T2, meanwhile a high voltage level is applied to remaining control lines (including the second writing control line R2, the reset control line Reset and the driving control line S), so that the remaining TFTs are turned off. As illustrated in FIG. 5a, the Vdata charges the capacitor C along T1 and T2, a voltage at the point a is V1−Vth2 (which satisfies that a voltage difference between the gate and source of the T2 is Vth2, wherein the Vth2 is a threshold voltage of the T2) after the charging is completed.

In the second charging phase 3, a second data voltage V2 required by the OLED' to emit light during this frame is applied on the data voltage line Vdata, the low voltage level is applied on the second writing control line R2 in order to turn on the T1' and T2', meanwhile the high voltage level is applied to remaining control lines, so that the remaining TFTs are turned off. As illustrated in FIG. 5b, the Vdata charges the capacitor C' along T1' and T2', a voltage at the point b is V2−Vth2' (which satisfies that a voltage difference between the gate and source of the T2' is Vth2', wherein the Vth2' is a threshold voltage of the T2') after the charging is completed.

In the light emitting phase 4, the low voltage level is applied on the driving control line S in order to turn on the T4 and T4', and the T3 and T3' are also turned on because a voltage on the operating voltage line Vdd generally is far greater than V1−Vth2 and V2−Vth2', meanwhile the high voltage level is applied to remaining control lines, so that the remaining TFTs are turned off. As illustrated in FIG. 5c, the Vdd supplies power to the OLED along T3 and T4, and supplies power to the OLED' along T3' and T4', so that the OLED and OLED' emit light.

According to a current characteristics of the TFT in a saturation area, a current flowing through the OLED may be obtained as:

$$I_{OLED}=K(VGS-Vth3)^2=K[Vdd-(V1-Vth2)-Vth3]^2.$$

Wherein Vth2 is the threshold voltage of the T2, the Vth3 is a threshold voltage of the T3, and the threshold voltages of T2 and T3 is seemed to be identical with each other based on a principle for a mirror circuit, namely, Vth2=Vth3.

Then, $I_{OLED}=K(Vdd-V1)^2$. Similarly, a current flowing through the OLED' may be obtained as:

$$I_{OLED'}=K[Vdd-V2]^2.$$

From the above two equations, it can be seen that the operating currents flowing through the two electroluminescent units are not affected by the threshold voltages of the driving transistors and are only related to the data voltage applied on the data voltage line Vdata in this situation. It completely avoids the problem of drifting of the threshold voltage (Vth) of driving transistors caused by the process and long operation, eliminates the effect on the current flowing through the electroluminescent unit caused by the drifting, and ensures a normal operation of the electroluminescent unit.

Optionally, when the pixel circuit according to the first embodiment further comprises the reset transistor, the method may further comprise, before the first charging phase 2:

in a resetting phase 1, as illustrated in FIG. 4, the low voltage level signal is applied on the reset control line Reset, the high voltage level signal is applied on remaining control lines, in this situation, all TFTs are turned off except that the T5 and T5' are turned on, the terminal a of the capacitor C and the terminal b of the capacitor C' are input the reset low voltage level, so that the terminal a of the capacitor C and the terminal b of the capacitor C' reach to the low voltage level rapidly.

In this manner, the effect on the current light emitting caused by the voltages at the capacitors C and C' in the last frame can be eliminated.

Second Embodiment

FIG. 6 is an exemplary view illustrating a circuit structure of a pixel circuit provided by a second embodiment of the present disclosure. As illustrated in FIG. 6, in the pixel circuit provided by the second embodiment of the present disclosure, the structures of the two driving modules are also the same, so the description would be made by only taking the first driving module 210 as an example thereafter for a purpose of convenience. As illustrated in FIG. 6, the first driving module 210 comprises a first driving transistor T2, a second driving transistor T3, a third driving transistor T4, a fourth driving transistor T5 and a storage capacitor C (as for the second driving module 220, its first driving transistor, second driving transistor, third driving transistor, fourth driving transistor and the storage capacitor are denoted as T2', T3', T4', T5' and C' sequentially in the drawings); wherein a gate of the first driving transistor T2 is connected with a driving control line S, a source thereof is connected with an operating voltage line Vdd, the drain thereof is connected with a source of the second driving transistor T3; a gate of the second driving transistor T3 is connected with the first terminal, namely, the terminal a1, of the storage capacitor C (for the capacitor C', it first terminal is the terminal a2), the drain thereof is connected with a source of the third driving transistor T4; a gate of the third driving transistor T4 is connected with the driving control line S, the drain thereof is connected with the OLED; a drain of the fourth driving transistor T5 is connected with the drain of the second driving transistor T3, a source thereof is connected with the first terminal, namely, the terminal a1, of the storage capacitor C; a gate of the fourth driving transistor T5 is connected with the first writing control line (for the second driving module, the gate of the fourth driving transistor T5' is connected with the second writing control line); the second terminal, namely, the terminal b1, of the storage capacitor C is grounded (for the capacitor C', its second terminal is the terminal b2).

In an alternative embodiment of the present disclosure, an operating current flowing through the electroluminescent unit would not be affected by a threshold voltage of the corresponding driving transistor, which completely avoids a problem of non-uniformity in a display brightness caused by drifting of the threshold voltage of the driving transistor. Also, in the embodiments of the present disclosure, two pixel only use three control lines, one operating voltage lines and one data voltage line, so the number of signal lines used are decreased greatly, thus a pixel density can be further increased.

Furthermore, the pixel circuit may further comprise reset transistors T6 and T6', gates of both of the reset transistors T6, T6' are connected with a reset control line Reset; a source of the reset transistor T6 is connected with the first terminal a1 of the storage capacitor C, a drain thereof is connected with the second terminal b1 of the storage capacitor C; a source of the reset transistor T6' is connected with the first terminal a2 of the storage capacitor C', a drain thereof is connected with the second terminal b2 of the storage capacitor C'.

Similarly, in the present embodiment of the present disclosure, the initialization of the driving module can be also realized rapidly and completely.

Optionally, the pixel circuit according to the present embodiment of the disclosure further comprises a capacitive touch detection module 410 and a photo-sensitive touch detection module 420. The capacitive touch detection module 410 comprises a first touch transistor M1, a second touch transistor M2, a third touch transistor M3, a first sensing capacitor Cc and a touch electrode d. A gate of the first touch transistor M1 is connected with the reset control line Reset, a source thereof is connected with the data voltage line Vdata, a drain thereof is connected with a first terminal, a terminal a3, of the first sensing capacitor Cc; a gate of the second touch transistor M2 is connected with the first terminal, the terminal a3, of the first sensing capacitor Cc, a source thereof is connected with a second terminal, a terminal b3, of the first sensing capacitor Cc, a drain thereof is connected with a source of the third touch transistor M3; a gate of the third touch transistor M3 is connected with a first writing control line R1, a drain thereof is connected with a touch signal reading line Y-read line; the second terminal b3 of the first sensing capacitor Cc is further connected with a detection driving voltage line Vcom; the touch electrode d is connected with the gate of the M2, and the touch electrode d is also connected with the capacitor Cc because that the gate of M2 is further connected with one terminal of Cc, wherein the capacitor Cc functions to hold a voltage at the touch electrode d.

With the touch detection module having such structure, when a user performs a touch operation, an induction capacitor would formed between a finger of the user or other touch apparatus and the touch electrode connected with the sensing capacitor, so a touch position can be detected accurately by measuring a position of the induction capacitor.

The photo-sensitive touch detection module 420 comprises a fourth touch transistor M4, a fifth touch transistor M5, a sixth touch transistor M6, a seventh touch transistor M7 and a second sensing capacitor Cp. A gate of the fourth touch transistor M4 is connected with a second writing control line R2, a source thereof is connected with the data voltage line Vdata, a drain thereof is connected with a first terminal, terminal a4, of the second sensing capacitor Cp; a gate and a source of the fifth touch transistor M5 are connected with the first terminal, namely the terminal a4, of the second sensing capacitor Cp, a drain thereof is connected with a second terminal, terminal b4, of the second sensing capacitor Cp; a gate of the sixth touch transistor M6 is connected with the driving control line S, a source thereof is connected with the second terminal, namely the terminal b4, of the second sensing capacitor Cp, a drain thereof is connected with the touch signal reading line Y-read line; a gate of the seventh touch transistor M7 is connected with the reset control line Reset, a source thereof is connected with the first terminal, namely the terminal a4, of the second sensing capacitor Cp, a drain thereof is grounded; wherein the fifth touch transistor M5 is a photo-sensitive transistor (a photo Sensor).

Herein, the detection driving voltage line refers to a voltage line for supplying a driving pulse. Herein, the photo-sensitive transistor may generate different photoelectric currents under different intensities of illuminance.

In an alternative embodiment of the present disclosure, the circuit for detecting a touch and the circuit for pixel compensation share the control lines and the data voltage line, so that the number of signal lines used in the touch detection circuit and the pixel compensation circuit can be further decreased and the pixel density is further increased.

Optionally, except for the fifth touch transistor, remaining transistors among the transistors involved in the second embodiment of the present disclosure (including the writing transistors, the driving transistors, the touch transistors and the reset transistors) are P channel TFTs, and the fifth touch transistor is an N channel TFT.

Figure 7:
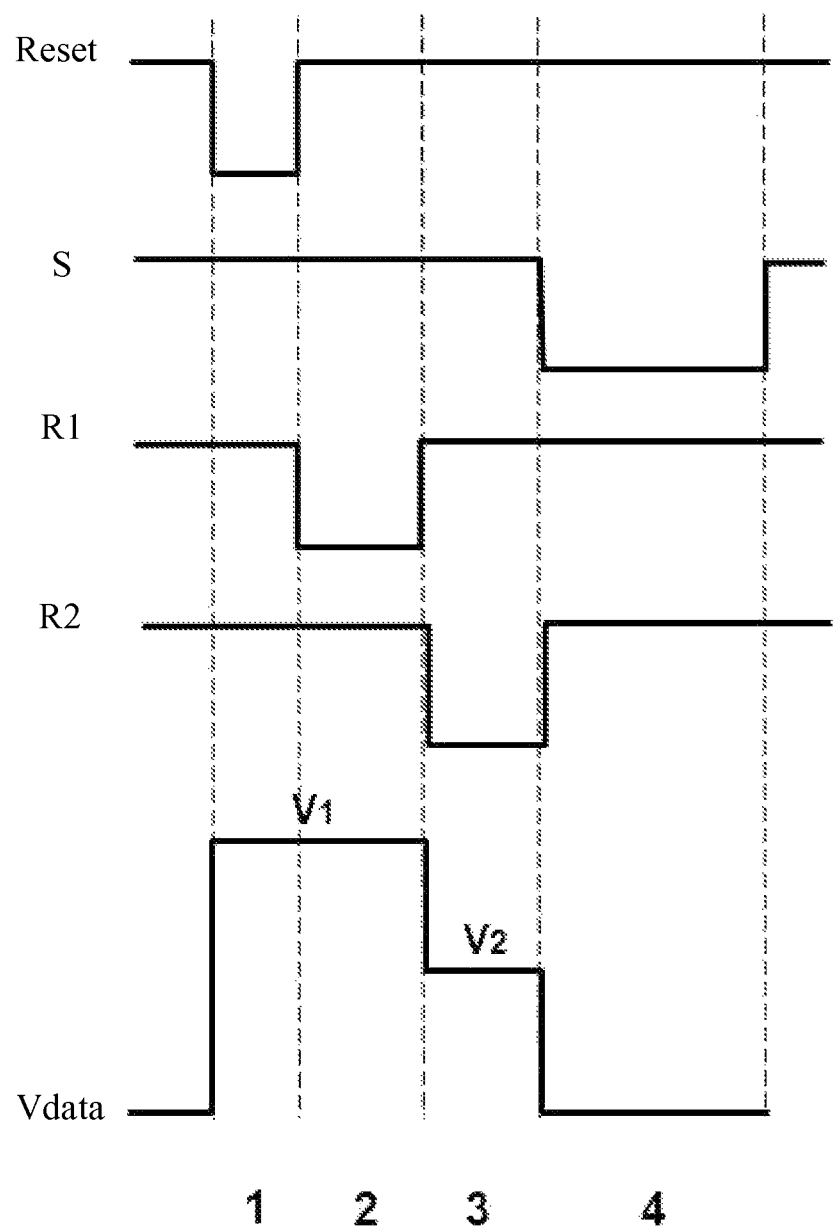
FIG. 7 is a timing chart of key signals in a method for driving the pixel circuit provided by the second embodiment of the present disclosure.
Figure 8A:
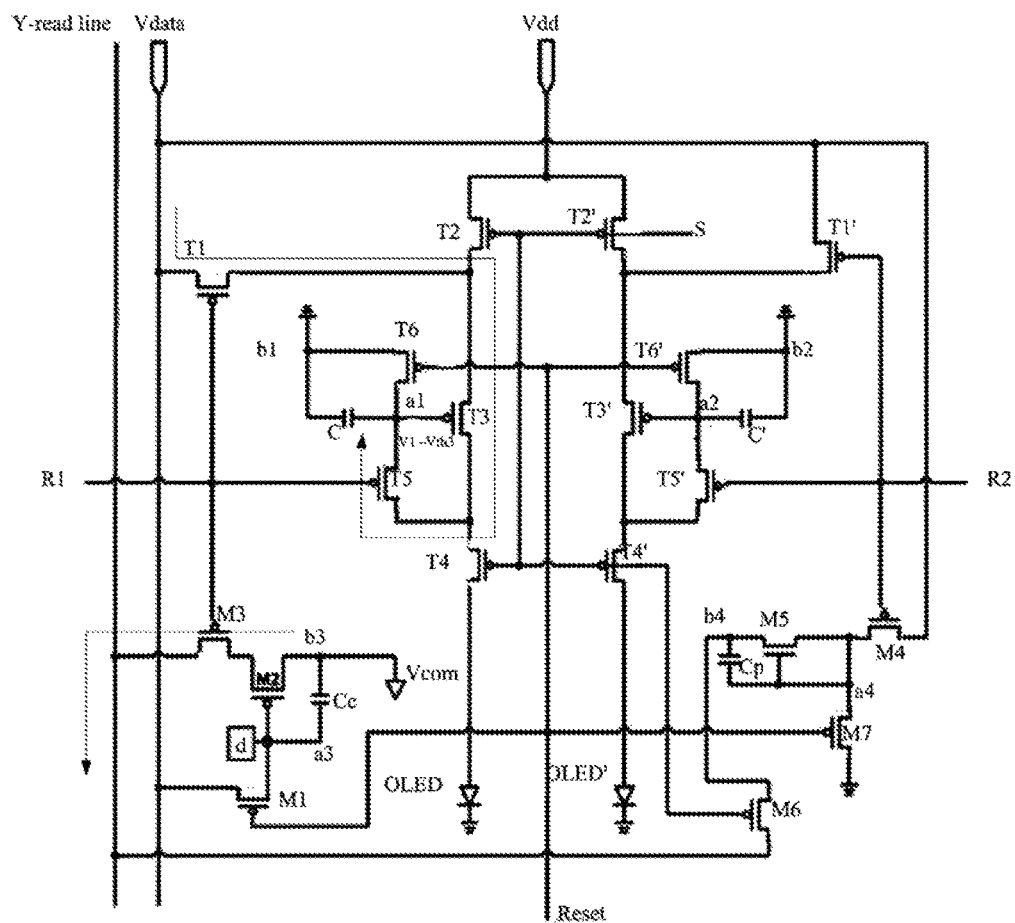
FIGS. 8a-8c are exemplary views illustrating current flows and voltage values of the pixel circuit under different timings according to the second embodiment of the present disclosure.
Figure 8B:
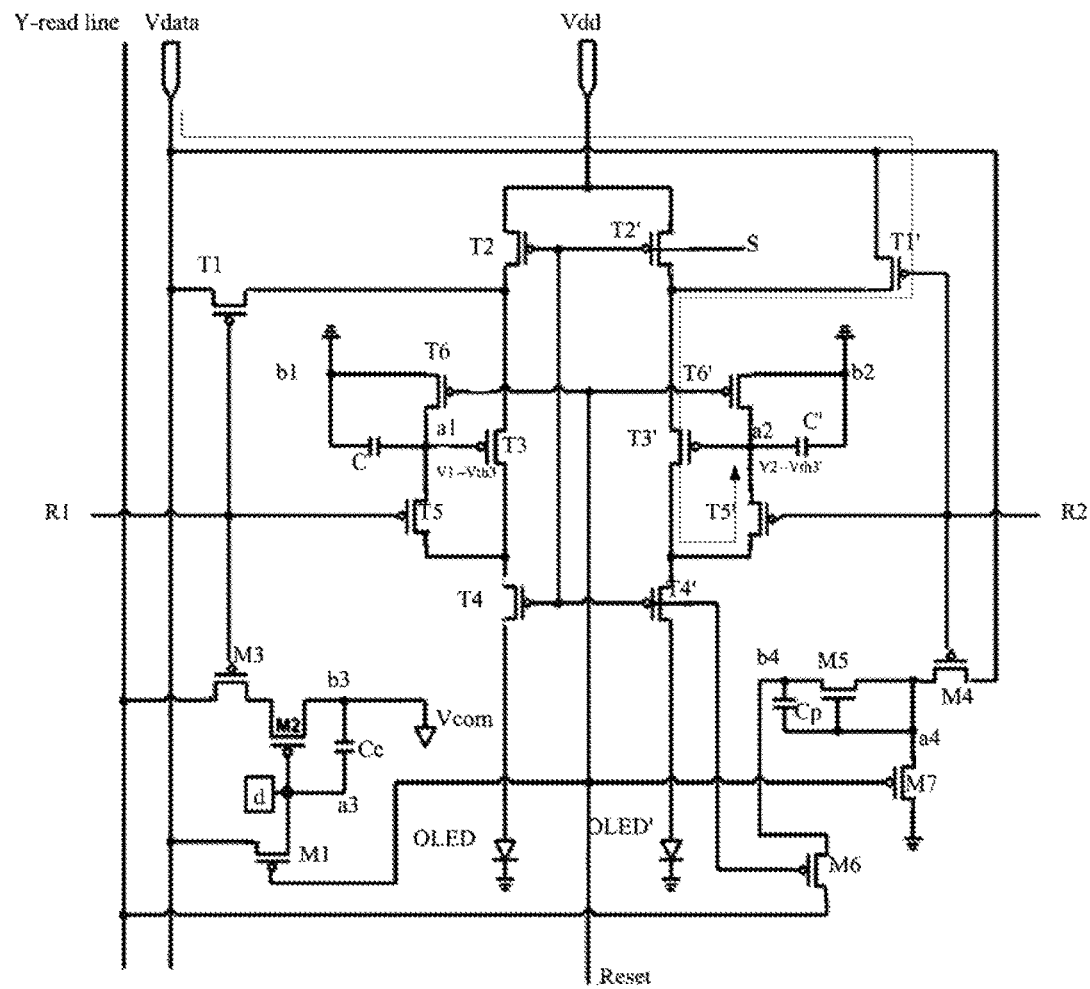
Figure 8C:
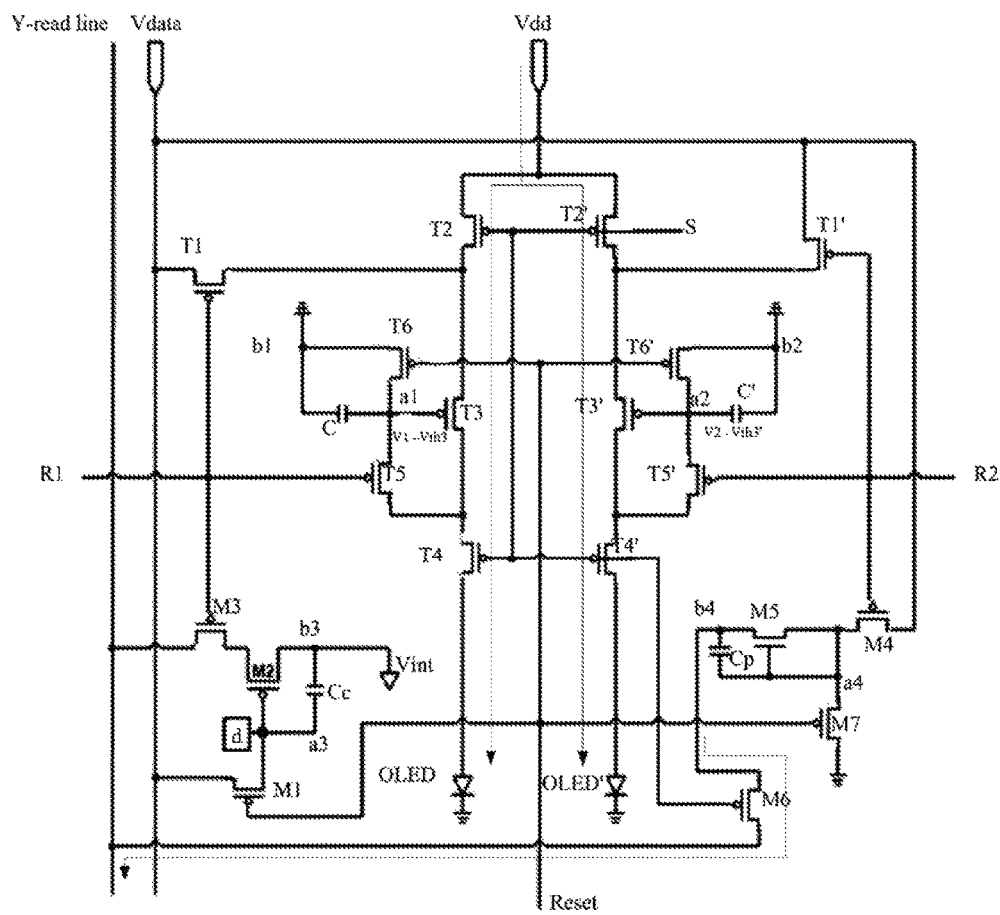

An alternative method for driving the pixel circuit provided by the second embodiment of the present disclosure would be described thereafter in connection with FIGS. 7 and 8. FIG. 7 is a timing chart of key signals in a method for driving the pixel circuit provided by the second embodiment of the present disclosure. As illustrated in FIG. 7, the process for driving each frame of pixel data may be divided as a first charging phase 2, a second charging phase 3 and a light emitting phase 4. FIGS. 8a-8c are exemplary views illustrating current flows and voltage values of the pixel circuit under different timings according to the second embodiment of the present disclosure. The current flows and voltage values of the pixel circuit in the respective phases 2-4 described above are as illustrated in FIGS. 8a, 8b, 8c, respectively.

In the first charging phase 2, referring to FIG. 7, a low voltage level is applied on the R1, a high voltage level is applied on the remaining control lines, and a first data voltage V1 (herein, the V1 refers to the voltage required by the OLED to emit light, correspondingly, the V2 below refers to the voltage required by the OLED' to emit light) is applied on the data voltage line Vdata. Referring to FIG. 8a, in this situation, for a pixel compensation portion (including the reset transistors, driving modules and the data voltage writing module), the T1, T3, T5 are turned on and other TFTs are turned off, the signal on the Vdata starts to charge the point a1 along T1→T3→T5 until the point a1 is charged to the V1−Vth3 (which satisfies that the voltage difference between the gate and source of the T3 is Vth3, wherein the Vth3 is the threshold voltage of the T3). During this process, a potential at the point b1 which is grounded is always 0, therefore a potential at the point a1 would be maintained at V1−Vth3 after the charging is completed, and further because turning off the T4 and T4' make no current flow through the OLED and OLED', a life loss of the OLED and OLED' is decreased indirectly.

In the capacitive touch detection module, referring to FIG. 8a, the M1 is turned off, the M2 and M3 are turned on, in this situation, a couple pulse signal (Vint) at this phase supplies a potential at one terminal of the Cc to form a couple capacitor on the one hand, and functions as the source of the M2 (in this situation, M2 is equivalent to be an amplifying TFT) on the other hand. The finger's touch leads to a reduction of the potential at the gate of M2 directly (assuming reduced by Vf), a signal might pass the M2 only if the gate-source voltage of the M2 satisfied a turn-on condition of a MOS transistor, and it is a buffering phase for the touch detection module in this situation, that is, it waits for a reduction of the potential at the gate of the M2, and a main reason for reduction is the finger's touch.

In this situation, the transistors in the photo-sensitive touch detection module are all turned off and the photo-sensitive touch detection module is in a non-operation state.

In this situation, if the finger's touch occurs, which would directly lead to the reduction of the potential at the point d, the turn-on condition of the M2 is satisfied, and a I&V characteristic curve is located in an amplifying area, so the M2, as an amplifying TFT, would pass and amplify the signal of the couple pulse, and a signal in a Y direction is collected by the Y-read Line. Also, R1 as the scan signal in a horizontal direction (X direction) (because the signal in the Y direction can be collected only when the R1 is at the low voltage level and the R1 in a specified pixel is at the low voltage level signal at a specified time, thus a X coordinate can be determined according to the time at which the signal in the Y direction is collected) also has the collection function. As such, the X, Y coordinates of the touch position of the finger are determined. This process only requires the finger to touch, and the coordinate position can be collected at any time.

It can be seen that, in the embodiment of the present disclosure, the writing control line R1 functions as a touch signal reading line X-read line in the X direction (the X direction corresponds to the scan direction).

In the second charging phase 3, referring to FIG. 7, the low voltage level is applied on the R2, the high voltage level is applied on the remaining control lines, and a second data voltage V2 is applied on the data voltage line Vdata. In the pixel compensation circuit, T1', T3' and T5 are turned on, and remaining TFTs are turned off. Referring to FIG. 8b, the signal on Vdata starts to charge the point a2 along T1'→T3'→T5' until the point a2 is charged to the V2−Vth3' (which satisfies that the voltage difference between the gate and source of the T3' is Vth3', wherein the Vth3' is the threshold voltage of the T3'). During this process, a potential at the point b2 which is grounded is always 0, therefore a potential at the point a2 would be maintained at V2−Vth3' after the charging is completed, and further because turning off the T4 and T4' make no current flow through the OLED and OLED', the life loss of the OLED and OLED' is decreased indirectly.

In this situation, the transistors in the capacitive touch detection module are all turned off, and the capacitive touch detection module is in the non-operation state.

Meanwhile, in the photo-sensitive touch detection module, the gate and source of the M5 are connected with each other, the M7 is turned off, the M4 is turned on, a couple voltage V2 is output, and in this situation, a potential difference stored in the Cp is a fixed value. When the light irradiates on this module, the intensity of illuminance received by the photo-sensitive transistor M5 increases, the charging current increases, the voltage would be stored across the Cp temporarily, waiting for a read process in the next phase.

In the light emitting phase 4, as illustrated in FIG. 7, the low voltage level signal is applied on the driving control line S, and the high voltage level signal is applied on the other control lines, in this situation, in the pixel compensation circuit, the T2, T2', T4, T4' are all turned on, as illustrated in FIG. 8c, the Vdd supplies the power to the OLED along T2, T4 and supplies the power to the OLED' along T2', T4', so that the two organic light emitting diodes emit light.

According to the current characteristics of the TFT in the saturation area, the current flowing through the OLED may be obtained as:

$$I_{OLED}=K(VGS-Vth3)^2=K[Vdd-(V1-Vth3)-Vth3]^2=K(Vdd-V1)^2.$$

Similarly, the current flowing through the OLED' may be obtained as:

$$I_{OLED'}=K(Vdd-V2)^2.$$

From the above two equations, it can be seen that the operating currents flowing through the two electroluminescent units are not affected by the threshold voltages of the driving transistors and are only related to the data voltage applied on the data voltage line Vdata in this situation. It completely avoids the problem of drifting of the threshold voltage (Vth) of driving transistors caused by the process and long operation, eliminates the effect on the current flowing through the electroluminescent unit caused by the drifting, and ensures a normal operation of the electroluminescent unit.

In the photo-sensitive touch detection module, the M6 is turned on and remaining TFTs are turned off. As illustrated in FIG. 8c, in this situation, the current stored in the capacitor Cp is output to the Y-read line via the M6, and if a touch action occurs during this period of time, a change difference value of the intensity of the photoelectric signal before and after the touch is compared with a non-touch threshold value, and it is thereby determined whether the touch occurs (whether the intensity of illuminance changes). In this situation, the coordinate in the X direction is determined based on the output point on the S, and the coordinate in the Y direction is still determined by the Y-read Line. At this time, the Read Line is used to collect the touch signal for the second time.

In this situation, the transistors in the capacitive touch detection module are all turned off, and the capacitive touch detection module is in the non-operation state.

Furthermore, before the first charging phase 2, it may further comprise the resetting phase 1 as shown in FIG. 7. In this situation, the low voltage level is applied on the Reset line, and the high voltage level is applied on the other control lines, so that the T6, T6', M7 are turned on to set the voltages at the first terminals of the capacitors C, C' and Cp as 0. In this manner, the voltages in the capacitors can be ensured to be reset as 0 rapidly and are prevented from interfering with the subsequent light emitting or touch detection.

It should be noted that, in the method for driving the pixel circuit according to the embodiment of the present disclosure, the orders of the first charging phase 2 and the second charging phase 3 may be exchanged, and the reversal order of these two charging phases would not affect the implementation of the present disclosure.

Third Embodiment

FIG. 9 is an exemplary view illustrating a circuit structure of a pixel circuit provided by a third embodiment of the present disclosure. As illustrated in FIG. 9, in the pixel circuit provided by the third embodiment of the present disclosure, the structures of the two driving modules are also the same, so the description would be made by only taking the first driving module 210 as an example thereafter for a purpose of convenience. As illustrated in FIG. 9, each of the driving modules comprises a first driving transistor T2, a second driving transistor T3, a third driving transistor T4, a fourth driving transistor T5 and one storage capacitor C (for the second driving module 220, its first driving transistor, second driving transistor, third driving transistor, fourth driving transistor and the storage capacitor are denoted as T2', T3', T4', T5' and C' sequentially in the drawings). A gate of the first driving transistor T2 is connected with a first driving control line S1, a source thereof is connected with the drains of the second driving transistor T3 and the third driving transistor T4, a drain thereof is connected with the operating voltage line Vdd; a gate of the second driving transistor T3 is connected a the second driving control line S2, a source thereof is connected with a first terminal, namely the terminal a, (for C', its first terminal is denoted as terminal b in FIG. 9) of the storage capacitor C; a gate of the third driving transistor T4 is connected with the first terminal, the terminal a, of the storage capacitor C, a source thereof is connected with the OLED; a gate and a drain of the fourth driving transistor T5 are connected with the first terminal, the terminal a, of the storage capacitor C, a source thereof is connected with the corresponding writing transistor T1; and a second terminal of the storage capacitor C is connected with the low voltage level line.

Herein, the voltage on the low voltage level line may be a low voltage level whose voltage is not 0, or may be 0 (that is, the ground line GND).

Optionally, the transistors in the third embodiment of the present disclosure, including the writing transistors and the driving transistors, are all the N channel TFTs.

Figure 10:
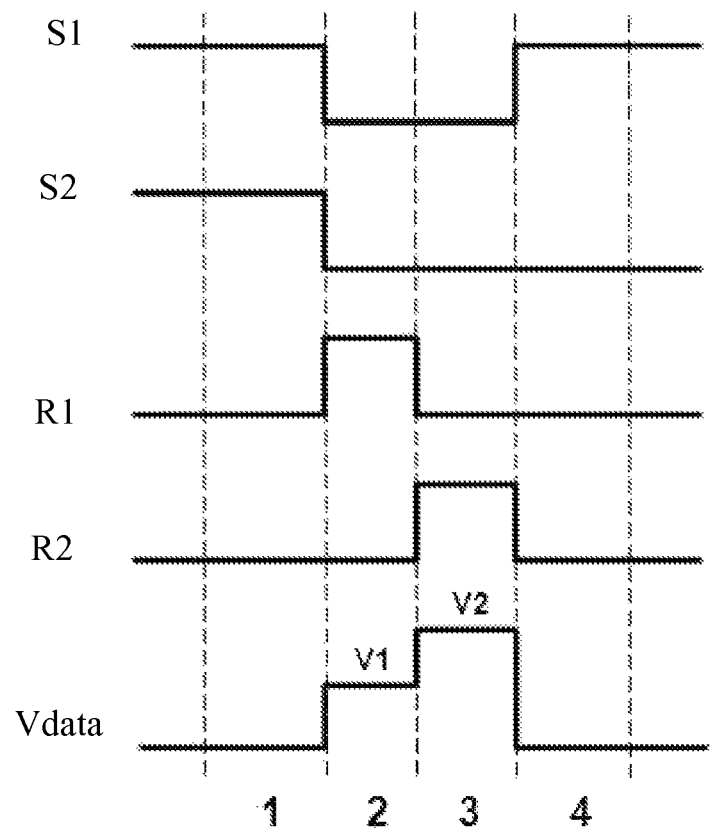
FIG. 10 is a timing chart of key signals in a method for driving the pixel circuit provided by the third embodiment of the present disclosure.

An alternative method for driving the pixel circuit provided by the third embodiment of the present disclosure would be described thereafter in connection with FIGS. 10 and 11. FIG. 10 is a timing chart of key signals in a method for driving the pixel circuit provided by the third embodiment of the present disclosure. As illustrated in FIG. 10, the process for driving each frame of pixel data may be divided as a resetting phase 1, a first charging phase 2, a second charging phase 3 and a light emitting phase 4. FIGS. 11a-11d are exemplary views illustrating current flows and voltage values of the pixel circuit under different timings according to the third embodiment of the present disclosure. The current flows and voltage values of the pixel circuit in the respective phases 1-4 described above are as illustrated in FIGS. 11a, 11b, 11c, 11d, respectively.

Figure 11A:
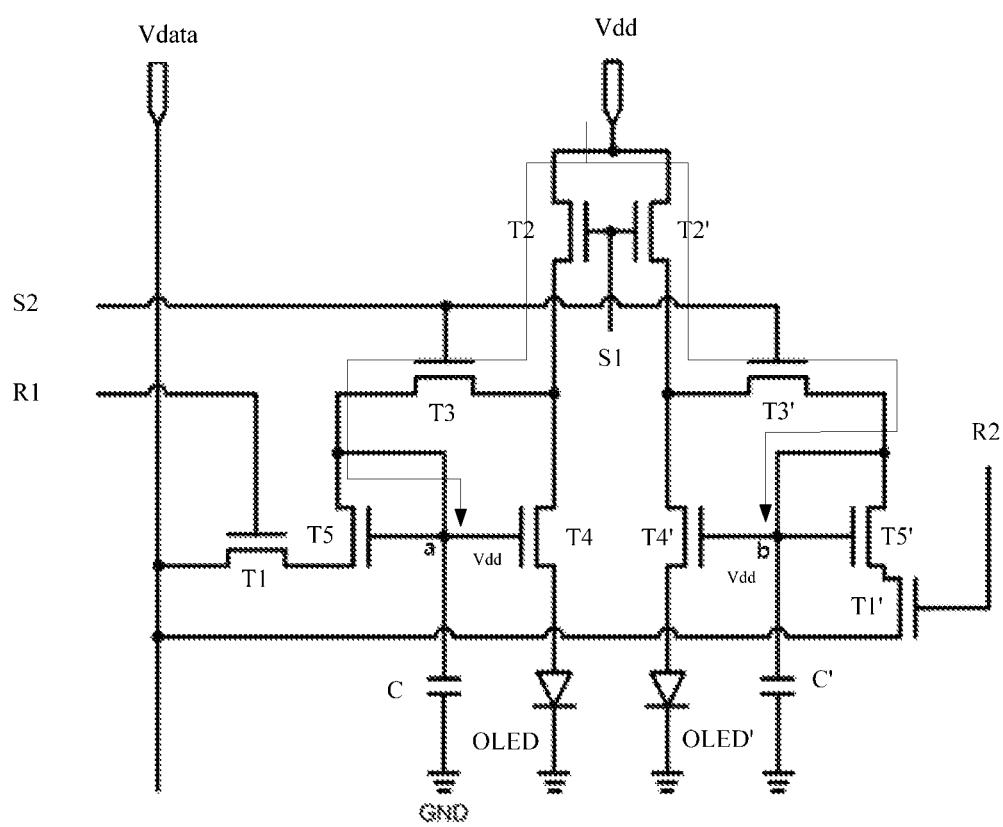
FIGS. 11a-11d are exemplary views illustrating current flows and voltage values of the pixel circuit under different timings according to the third embodiment of the present disclosure.

In the resetting phase 1, as illustrated in FIG. 10, a high voltage level signal is applied on the first driving control line S1 and the second driving control line S2, a low voltage level signal is applied on both of the first writing control line R1 and the second writing control line R2, so that the T2, T3, T2', T3 are all turned on and the remaining TFTs are turned off. As illustrated in FIG. 11a, in this situation, the operating voltage line Vdd charges the terminal a of the capacitor C along T2 and T3, and charges the terminal b of the capacitor C' along the T2' and T3', therefore the potentials at the terminals a, b are the same as the voltage in the Vdd, namely Vdd, after the charging is completed.

Figure 11B:
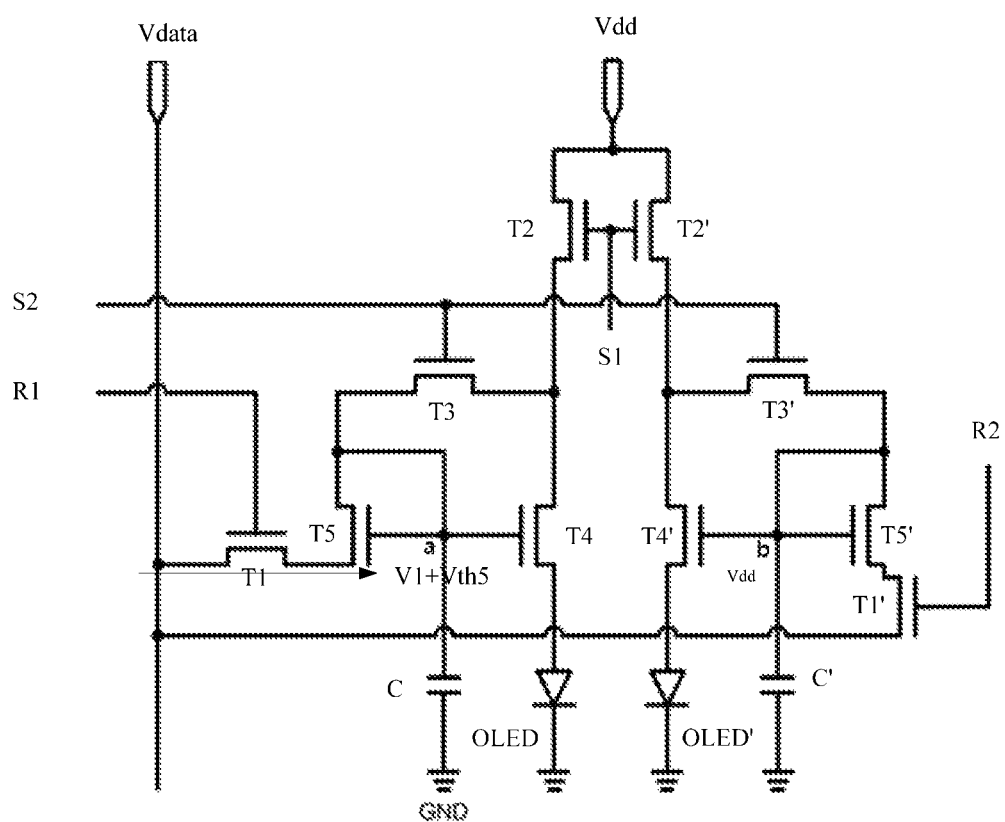

In the first charging phase 2, as illustrated in FIG. 10, a first data voltage V1 required by the OLED to emit light during this frame is applied on the data voltage line Vdata, the low voltage level signal is applied on the first driving control line S1 and the second driving control line S2, so that the T2, T3, T2', T3' are all turned off, and the high voltage level is applied on the first writing control line R1 so as to turn on the T1. In this situation, as illustrated in FIG. 11b, a source voltage of the T5 becomes V1, the T5 is turned on because a gate voltage of the T5 is the higher voltage, Vdd, the capacitor C discharges to the data voltage line Vdata until the gate voltage of the T5 reduces to V1+Vth5 (which maintains that the voltage difference between the gate and source is the threshold voltage Vth5 of the T5). This process is equivalent to a process for recharging the terminal a of the capacitor C.

Figure 11C:
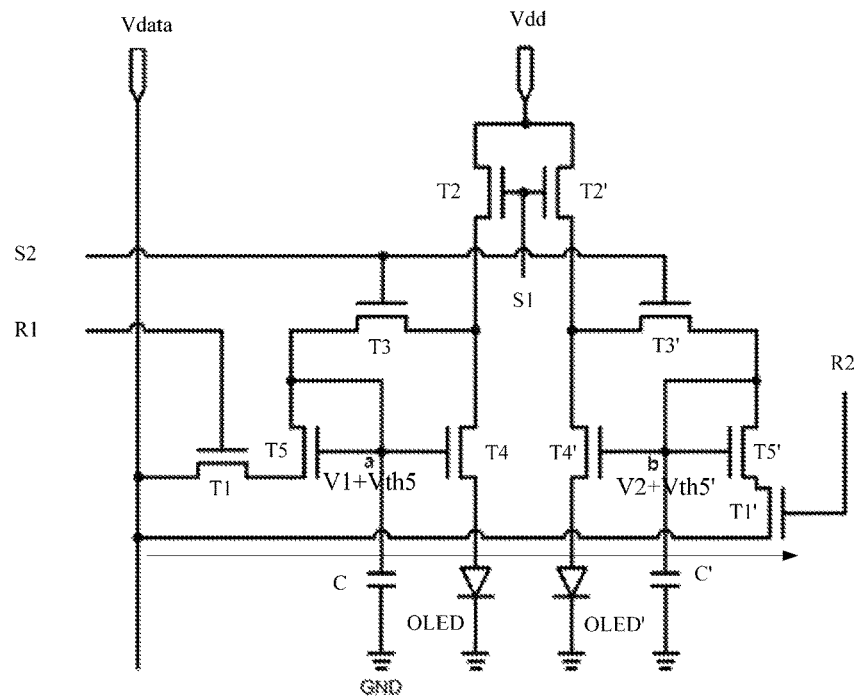
Figure 11D:
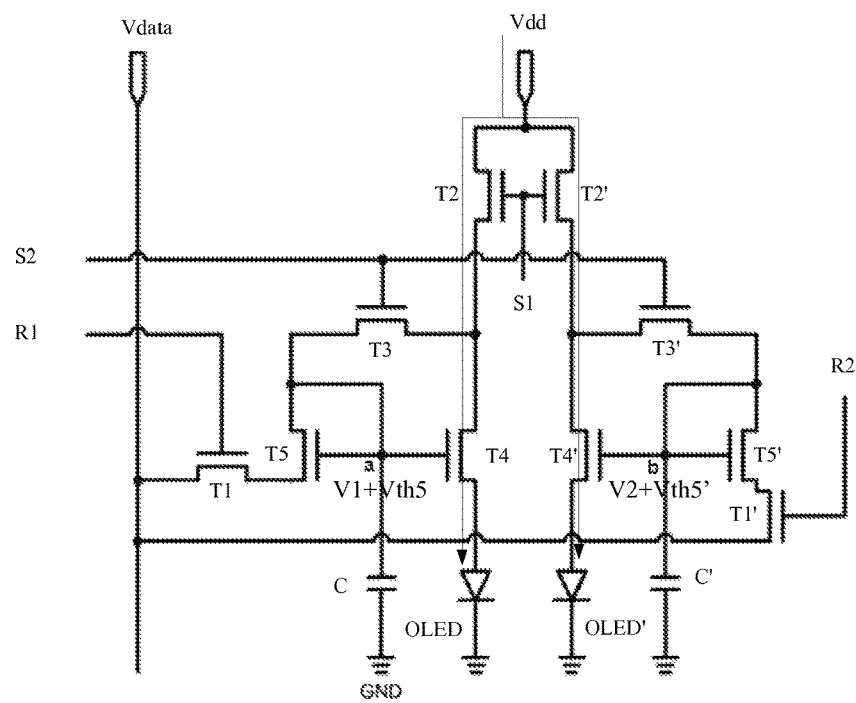

In the second charging phase 3, as illustrated in FIG. 10, a second data voltage V2 required by the OLED' to emit light during this frame is applied on the data voltage line Vdata, the low voltage level signal is applied on the first driving control line S1 and the second driving control line S2, so that the T2, T3, T2', T3' are all turned off, and the high voltage level is applied on the second writing control line R2 so as to turn on the T1'. As illustrated in FIG. 11c, a source voltage of the T5' becomes V2, the T5' is turned on because a gate voltage of the T5' is the higher voltage, Vdd, the capacitor C' discharges to the data voltage line Vdata until the gate voltage of the T5' reduces to V2+Vth5' (which maintains that the voltage difference between the gate and source is the threshold voltage Vth5' of the T5'). This process is equivalent to a process for recharging the terminal b of the capacitor C'.

In the light emitting phase 4, as illustrated in FIG. 10, the high voltage level signal is applied on the first driving control line S1 and the low voltage level signal is applied on the other control lines, in this situation, the T2 and T2' are turned on, and the T4 and T4' are also turned on because the potentials at the points a, b are high, the Vdd supplies power to the OLED via T2 and T4 so that the OLED emits light, and the Vdd supplies power to the OLED' via T2' and T4' so that the OLED' emits light.

According to the current characteristics of the TFT in the saturation area, the current flowing through the OLED may be obtained as:

$$I_{OLED}=K(VGS-Vth4)^2=K[V1+Vth5-V_{OLED}-Vth4]^2.$$

Wherein Vth4 is the threshold voltage of the T4, and the threshold voltages of T4 and T5 is seemed to be identical with each other based on the principle for the mirror circuit, namely, Vth4=Vth5, $V_{OLED}$ is a turn-on voltage of the OLED.

Then, $I_{OLED}=K(V1-V_{OLED})^2$. Similarly, the current flowing through the OLED' may be obtained as:

$$I_{OLED'}=K[V2-V_{OLED}]^2.$$

From the above two equations, it can be seen that the operating currents flowing through the two electroluminescent units are not affected by the threshold voltages of the driving transistors and are only related to the data voltage applied on the data voltage line Vdata in this situation. It completely avoids the problem of drifting of the threshold voltage (Vth) of the driving transistors caused by the process and long operation, eliminates the effect on the current flowing through the electroluminescent unit caused by the drifting, and ensures a normal operation of the electroluminescent unit.

Fourth Embodiment

Figure 12:
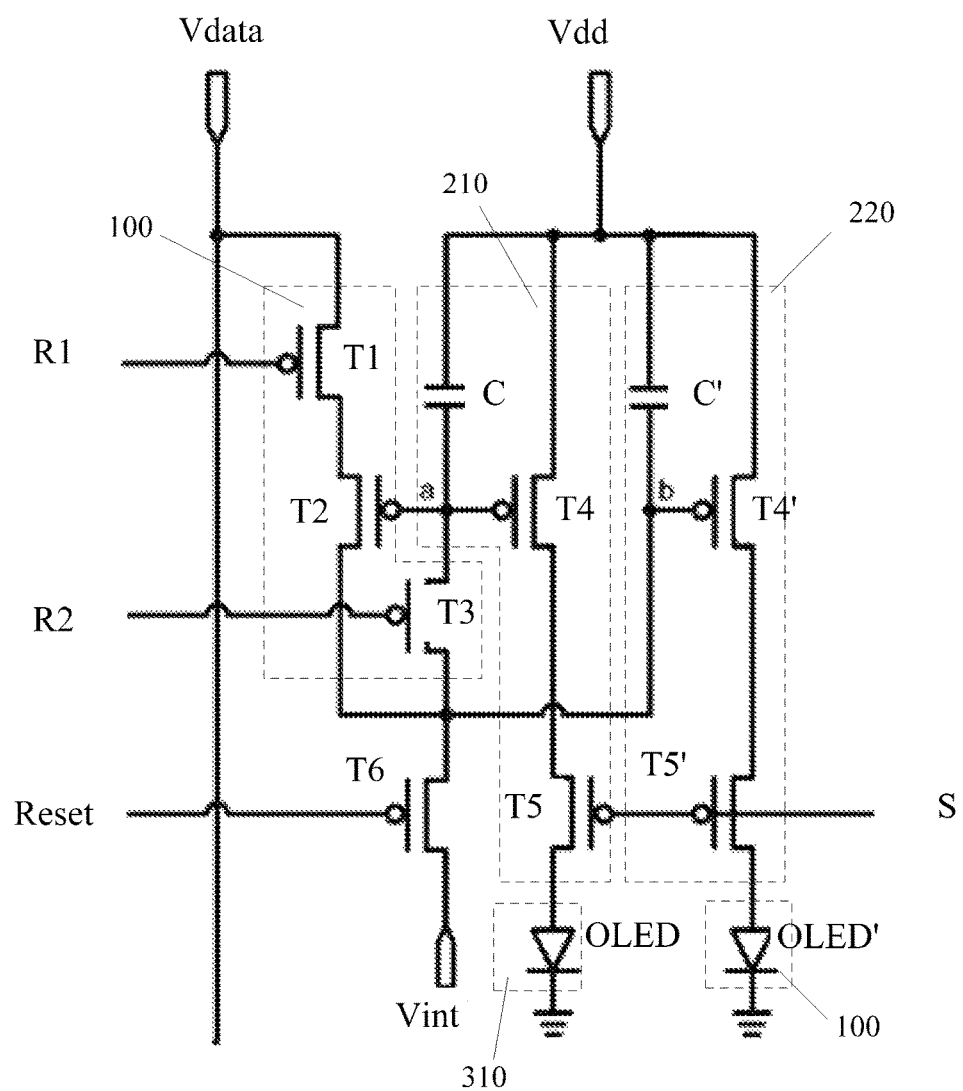
FIG. 12 is an exemplary view illustrating a circuit structure of a pixel circuit provided by a fourth embodiment of the present disclosure.

FIG. 12 is an exemplary view illustrating a circuit structure of a pixel circuit provided by a fourth embodiment of the present disclosure. In the another pixel circuit provided by the fourth embodiment of the present disclosure, as illustrated in FIG. 12, the data voltage writing module comprises three writing transistors, wherein a gate of a first writing transistor T1 is connected with a first writing control line R1, a source thereof is connected with a data voltage line Vdata, a drain thereof is connected with a source of a second writing transistor T2; a gate of the second writing transistor T2 is connected with the first driving module 210 and a drain of a third writing transistor T3, a drain thereof is connected with a source of the third writing transistor T3 and the second driving module 220; and a gate of third writing transistor T3 is connected with the second writing control line R2.

Optionally, in the pixel circuit provided by the fourth embodiment of the present disclosure, the structures of the two driving modules are also the same, so the description would be made by only taking the first driving module 210 as an example thereafter for a purpose of convenience. As illustrated in FIG. 12, the first driving module 210 comprises two driving transistors T4, T5 and one storage capacitor C (for the second driving module 220, the two driving transistors are denoted as T4', T5' in FIG. 12, and the capacitor is denoted as C'). A source of a first driving transistor T4 is connected with the operating voltage line Vdd, a drain thereof is connected with a source of a second driving transistor T5; a gate of the second driving transistor T5 is connected with the driving control line S, a source thereof is connected with the drain of the first driving transistor T4, a drain thereof is connected with the OLED; the storage capacitor C is connected between the gate and the source of the first driving transistor T4;

the gate of the first driving transistor T4 in the first driving module 210 is connected with the gate of the second writing transistor T2, and the gate of the first driving transistor T4' in the second driving module 220 is connected with the drain of the second writing transistor T2.

In an alternative embodiment of the present disclosure, an operating current flowing through the electroluminescent unit would not be affected by a threshold voltage of the corresponding driving transistor, which completely avoids the problem of non-uniformity in a display brightness caused by drifting of the threshold voltage of the driving transistor. Also, in the embodiments of the present disclosure, two pixels only use three control lines, one operating voltage line and one data voltage line, so the number of signal lines used are decreased greatly, thus a pixel density can be further increased.

Optionally, the pixel circuit may further comprise a reset transistor T6, a gate of the reset transistor T6 is connected with the reset control line Reset, a source thereof is connected with the drain of the second writing transistor T2, and a drain thereof is connected with the reset low voltage level line Vint.

Optionally, all of the transistors are P channel transistors.

Figure 13:
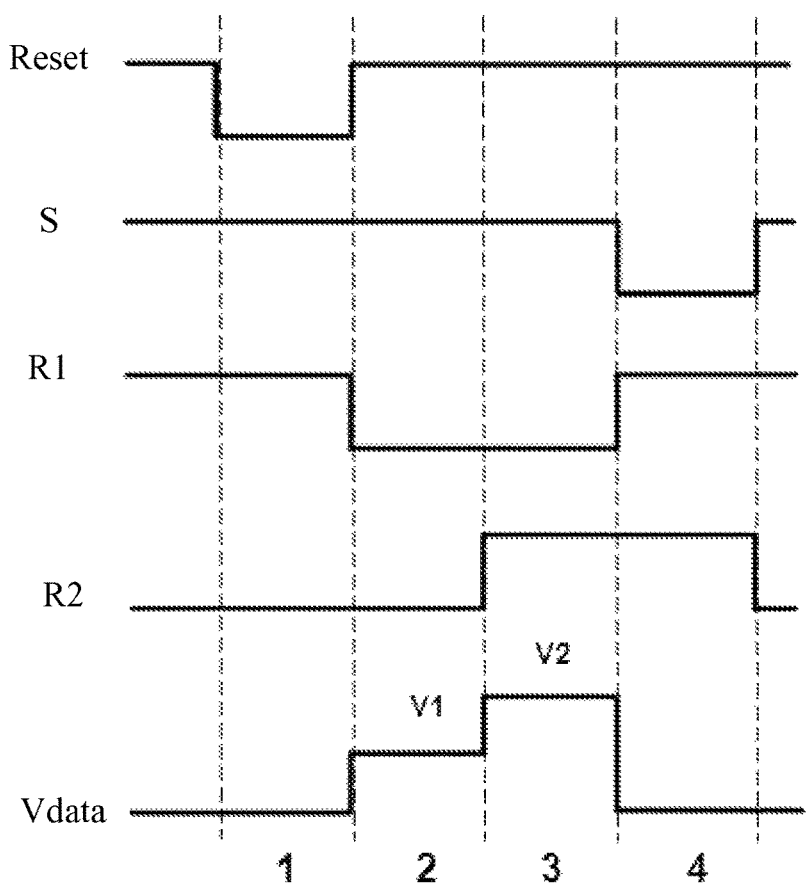
FIG. 13 is a timing chart of key signals in a method for driving the pixel circuit provided by the fourth embodiment of the present disclosure.
Figure 14A:
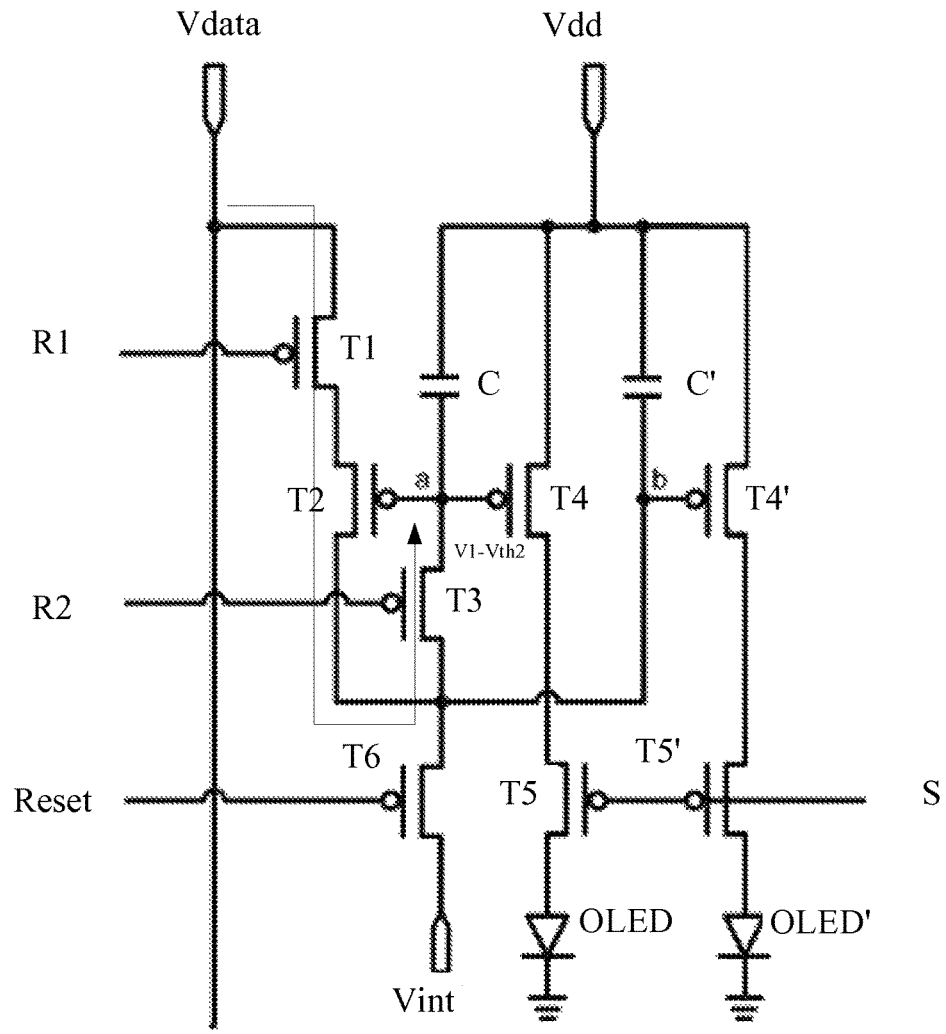
FIGS. 14a-14c are exemplary views illustrating current flows and voltage values of the pixel circuit under different timings according to the fourth embodiment of the present disclosure.
Figure 14B:
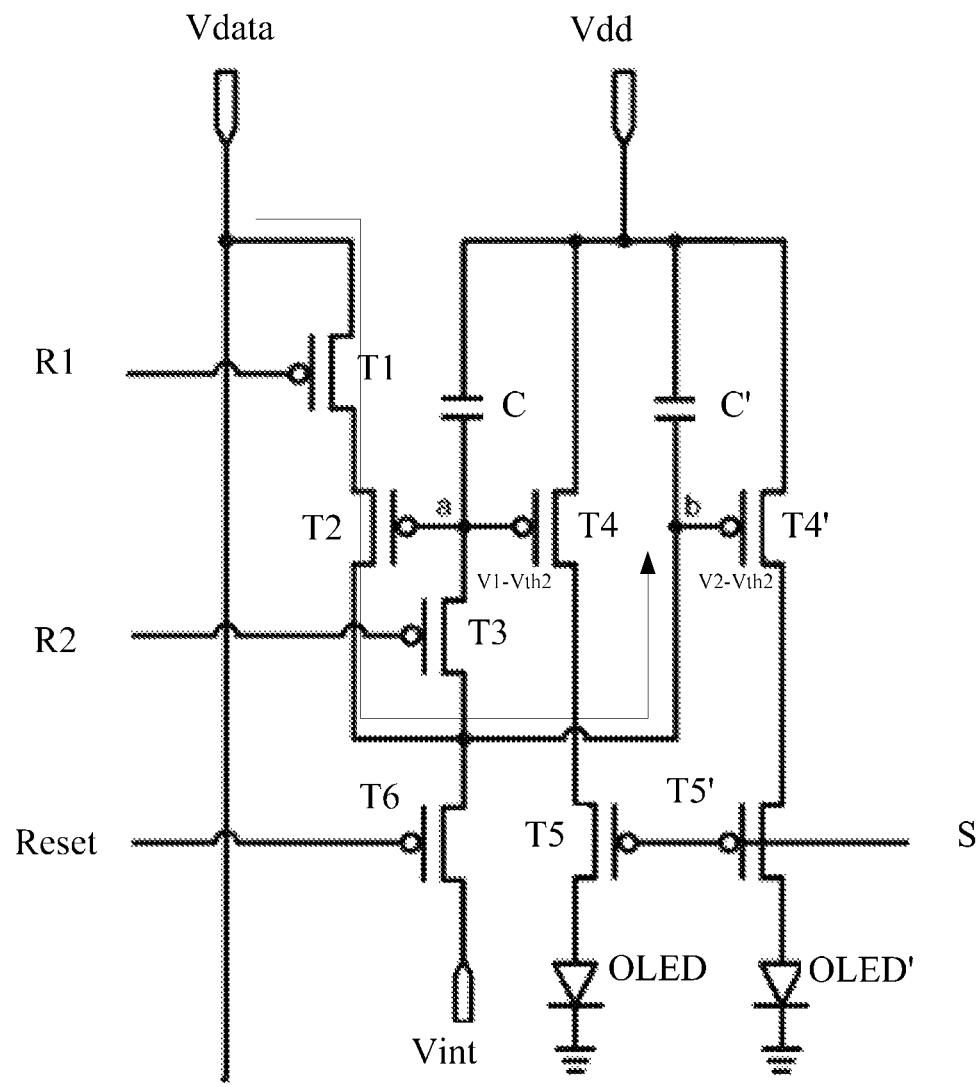
Figure 14C:
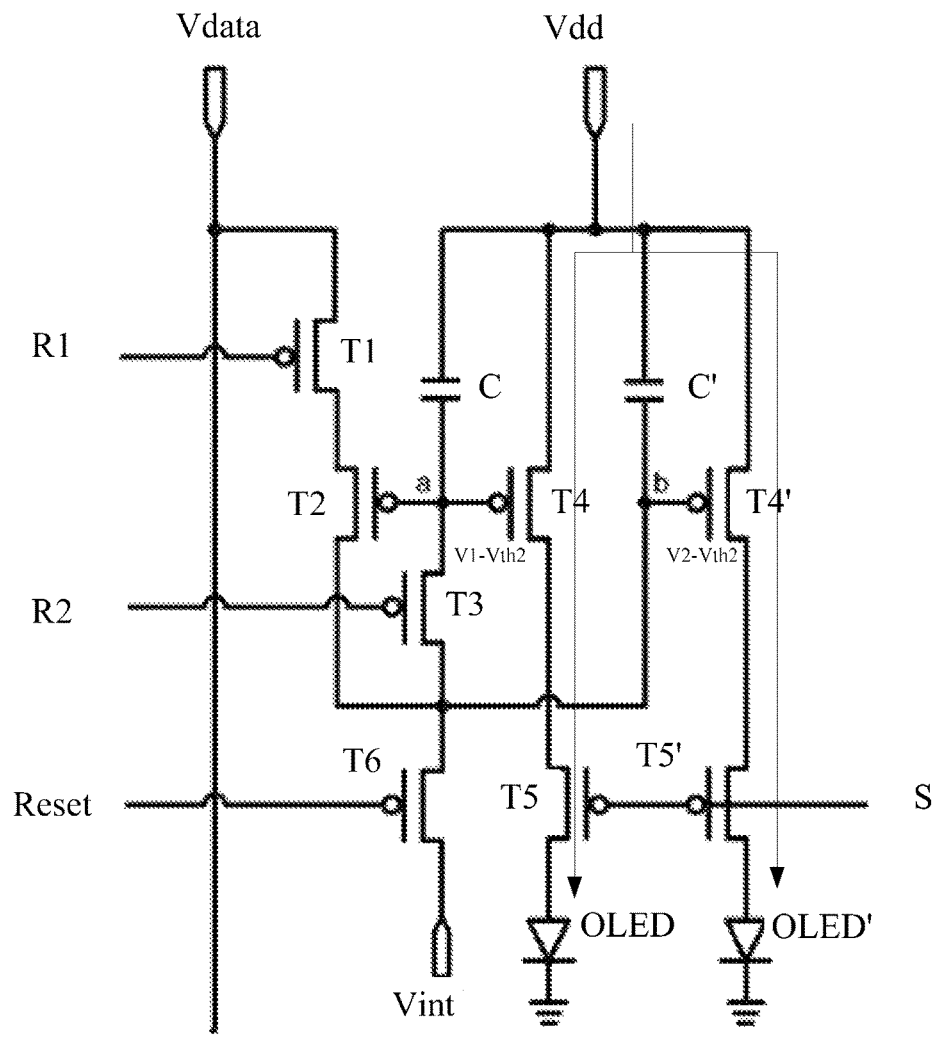

An alternative method for driving the pixel circuit provided by the fourth embodiment of the present disclosure would be described thereafter in connection with FIGS. 13 and 14. FIG. 13 is a timing chart of key signals in a method for driving the pixel circuit provided by the fourth embodiment of the present disclosure. As illustrated in FIG. 13, the process for driving each frame of pixel data may be divided as a first charging phase 2, a second charging phase 3 and a light emitting phase 4. FIGS. 14a-14c are exemplary views illustrating current flows and voltage values of the pixel circuit under different timings provided by the fourth embodiment of the present disclosure. The current flows and voltage values of the pixel circuit in the respective phases 2-4 described above are as illustrated in FIGS. 14a, 14b, 14c, respectively.

In the first charging phase 2, as illustrated in FIG. 13, a first data voltage V1 required by the OLED to emit light is applied on the data voltage line Vdata, a low voltage level is applied on the first writing control line R1 and the second writing control line R2, and a high voltage level is applied on the other control lines. In this situation, the T1 and T3 are turned on, the T2, as the driving TFT, is also turned on, as illustrated in FIG. 14a, Vdata charges the terminal a of the capacitor C via the T1, T2 and T3 until the point a is charged to V1−Vth2 (Vth2 is the threshold voltage of the T2).

In the second charging phase 3, as illustrated in FIG. 13, a second data voltage V2 required by the OLED' to emit light is applied on the data voltage line Vdata, the low voltage level is applied on the first writing control line R1, and the high voltage level is applied on the other control lines. In this situation, the T1 and T2 are turned on, as illustrated in FIG. 14b, Vdata charges the terminal b of the capacitor C' via the T1 and T2 until the point b is charged to V2−Vth2.

In the light emitting phase 4, as illustrated in FIG. 13, the low voltage level is only applied on the driving control line S, and the high voltage level is applied on the other control lines, in this situation, the T5 and T5' are turned on, as illustrated in FIG. 14c, the Vdd supplies the power to the OLED via the T4 and T5, and supplies the power to the OLED' via the T4' and T5'.

According to the current characteristics of the TFT in the saturation area, the current flowing through the OLED may be obtained as:

$$I_{OLED}=K(V_{GS}-Vth4)^2=K[V_{dd}-(V1-Vth2)-Vth4]^2.$$

Wherein Vth4 is the threshold voltage of the T4, and the threshold voltages of T4 and T2 is seemed to be identical with each other based on the principle for the mirror circuit, namely, Vth4=Vth2.

Then, $I_{OLED}=K(V_{dd}-V1)^2$. Similarly, based on the principle for the minor circuit, it may be considered as Vth2=Vth4=Vth4' since positions of the T2, T4 and T4' are close; the Vth4' is the threshold voltage of the T4.

Then the current flowing through the OLED' may be obtained as: $I_{OLED'}=K[Vdd-V2]^2$.

From the above two equations, it can be seen that the operating currents flowing through the two electroluminescent units are not affected by the threshold voltages of the driving transistors and are only related to the data voltage applied on the data voltage line Vdata in this situation. It completely avoids the problem of drifting of the threshold voltage (Vth) of the driving transistors caused by the process and long operation, eliminates the effect on the current flowing through the electroluminescent unit caused by the drifting, and ensures a normal operation of the electroluminescent unit.

Furthermore, before the first charging phase 2, it may further comprise a resetting phase 1 as shown in FIG. 13. In this situation, the low voltage level is applied on the Reset control line and the second writing control line R2, the T6 and T3 are turned on to set the voltages at the terminal a of the capacitor C and the terminal b of the capacitor C' as 0 respectively. In this manner, the voltages in the capacitors can be ensured to be reset as 0 rapidly and is prevented from interfering with the subsequent light emitting or touch detection.

Based on the same concept, the present disclosure further provides a display apparatus comprising any one of the pixel circuits described above.

FIGS. 15-18 are exemplary views illustrating a position relationship between the pixel circuit and pixels in the display apparatus provided by the embodiment of the present disclosure.

Figure 15:
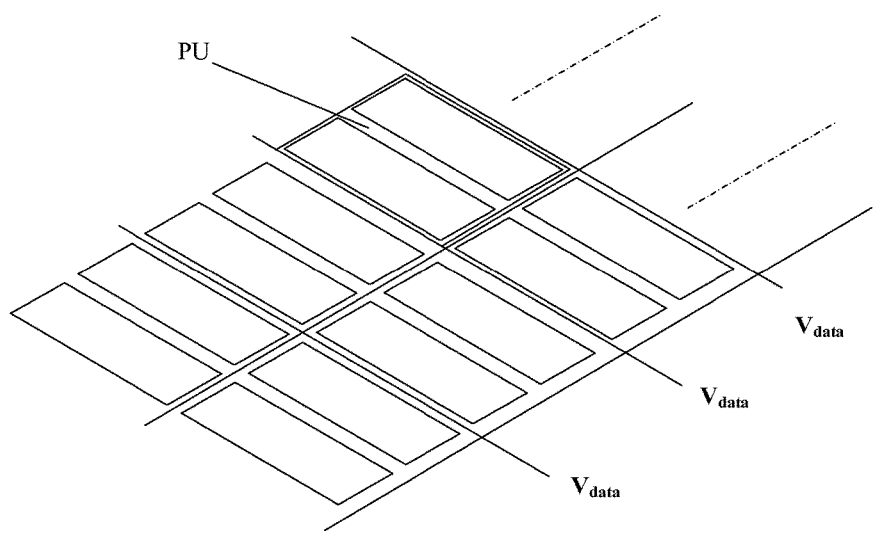
FIG. 15 is an exemplary view illustrating a position relationship between the pixel circuit and pixels in a display apparatus provided by an embodiment of the present disclosure.
Figure 16:
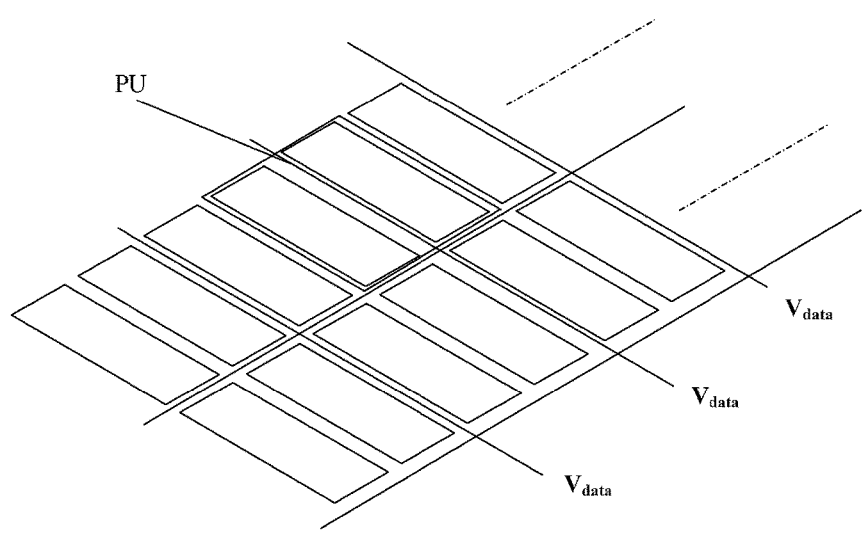
FIG. 16 is an exemplary view illustrating a further position relationship between the pixel circuit and pixels in a display apparatus provided by an embodiment of the present disclosure.

Optionally, in the display apparatus, one pixel circuit corresponds to two pixels. As illustrated in FIG. 15, the pixel circuits described above (PU in the drawings) may locate at the same side of the shared data voltage line, or as illustrated in FIG. 16, the pixel circuit PU described above may located at the both sides of the shard data voltage line.

Optionally, a pixel area of each pixel comprises a light emitting module and a driving module.

Further, if the data voltage writing module comprises two sub-data voltage writing modules, then each pixel corresponds to one sub-data voltage writing module. Thus, a distribution of components on corresponding substrate can be more even.

Further, if the pixel circuit provided by the second embodiment further comprises the capacitive touch detection module and the photo-sensitive touch detection module, then each of the two pixels corresponding to the pixel circuit comprises one touch detection unit.

Further, if the pixel circuit provided by the second embodiment further comprises the capacitive touch detection module and the photo-sensitive touch detection module, then in the apparatus comprising the pixel circuit, the capacitive touch detection module C locates at the pixel area of one pixel, and the photo-sensitive touch detection module P locates at the pixel area of the other pixel. In this situation, the two touch detection units may locate at both sides of the signal read line Read line, as illustrated in FIG. 17, or may locate at the same side of the signal read line Read line, as illustrated in FIG. 18.

Figure 17:
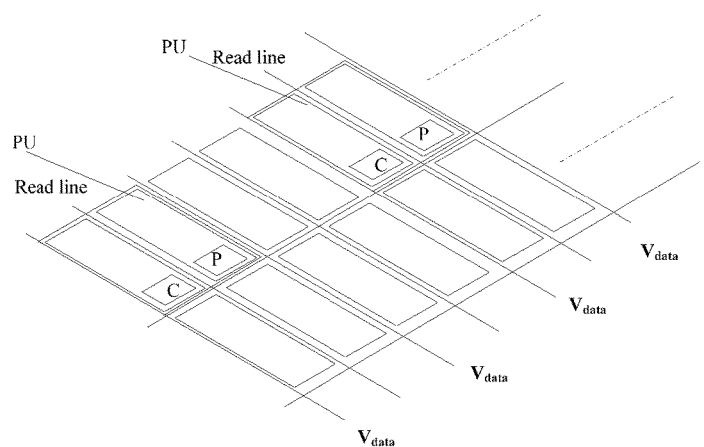
FIG. 17 is an exemplary view illustrating another position relationship between the pixel circuit and pixels in a display apparatus provided by an embodiment of the present disclosure.
Figure 18:
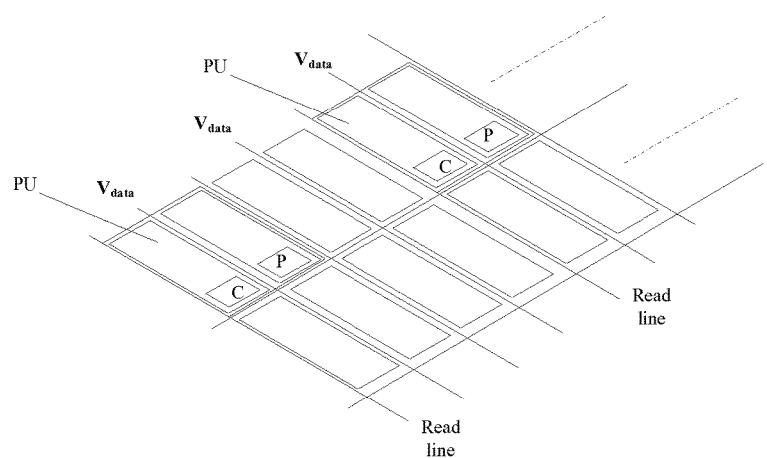
FIG. 18 is an exemplary view illustrating a still further position relationship between the pixel circuit and pixels in a display apparatus provided by an embodiment of the present disclosure.

Further, if the pixel circuit provided by the second embodiment further comprises the capacitive touch detection module and the photo-sensitive touch detection module, then as illustrated in FIG. 17 or 18, the pixel circuits are distributed periodically. In other pixels including no pixel circuit according to the embodiments of the present disclosure, a general pixel circuit may be arranged. Thus, it can avoid disposing the touch detection unit in each pixel, which reduces the manufacture complexity and the cost.

The display apparatus may be any other product or meas having the display function such as an electrical paper, a mobile phone, a tablet, a TV, a display, a notebook computer, a digital photo frame, a navigator.

The above descriptions only illustrate the optional embodiments of the present invention. It should be noted that those of ordinary skill in the art can also make a number of improvements and modifications without departing from the principles of the present disclosure, and these improvements and modifications are to be considered within the protection scope of the present disclosure.

The present application claims the priority of Chinese Patent Application No. 201410347992.5 filed on Jul. 21, 2014, entire content of which is incorporated as part of the present invention by reference.

What is claimed is:

1. A pixel circuit for driving two pixels comprising a data voltage writing module, two driving modules and two light emitting modules; wherein the data voltage writing module is connected with a data voltage line, two writing control lines and the two driving modules of the two pixels respectively, and is configured to write a first data voltage of a first pixel of the two pixels on the data voltage line to a first driving module according to input from a first writing control line among the two writing control line at first and then write a second data voltage of a second pixel of the two pixels on the data voltage line to a second driving module according to input from a second writing control line among the two writing control line in a same frame; the first driving module is connected with a first light emitting module of the first pixel, the second driving module is connected with a second light emitting module of the second pixel; and both of the two driving modules are connected with a driving control line and are configured to drive the two light emitting modules of respective pixels to emit light under the control of the driving control line, and both of the two driving modules are connected with a single operating voltage line, wherein the operating voltage line is configured to supply power to the two light emitting modules via the two driving modules.

2. The pixel circuit of claim 1, wherein the data voltage writing module comprises a first sub-data voltage writing module and a second sub-data voltage writing module, the first sub-data voltage writing module is connected with the data voltage line, the first writing control line and the first driving module, and the second sub-data voltage writing module is connected with the data voltage line, the second writing control line and the second driving module.

3. The pixel circuit of claim 2, wherein each of the sub-data voltage writing modules comprises a writing transistor, a gate of the writing transistor is connected with the corresponding writing control line, a source of the writing transistor is connected with the data voltage line, and a drain of the writing transistor is connected with the corresponding driving module.

4. The pixel circuit of claim 3, wherein each of the driving modules comprises three driving transistors and a storage capacitor, wherein a source of a first driving transistor is connected with the drain of the corresponding writing transistor, a gate and a drain of the first driving transistor are connected with a gate of a second driving transistor; a drain of the second driving transistor is connected with a source of a third driving transistor, a source of the second driving transistor is connected with the data voltage line; a gate of the third driving transistor is connected with the driving control line, a drain of the third driving transistor is connected with the light emitting module; a first terminal of the storage capacitor is connected with the gate of the second driving transistor, and a second terminal of the storage capacitor is connected with the source of the second driving transistor.

5. The pixel circuit of claim 4, wherein it further comprises a first reset transistor and a second reset transistor, a gate of the first reset transistor is connected with a reset control line, a source of the first reset transistor is connected with the first terminal of the storage capacitor in the first driving module, a drain of the first reset transistor is connected with a reset low voltage level line; a gate of the second reset transistor is connected with the reset control line, a source of the second reset transistor is connected with the first terminal of the storage capacitor in the second driving module, a drain of the second reset transistor is connected with the reset low voltage level line.

6. The pixel circuit of claim 5, wherein the transistors are P channel thin film transistors.

7. The pixel circuit of claim 4, wherein the transistors are P channel thin film transistors.

8. The pixel circuit of claim 3, wherein each of the driving modules comprises four driving transistors and a storage capacitor; wherein a gate of a first driving transistor is connected with the driving control line, a source of the first driving transistor is connected with an operating voltage line, a drain of the first driving transistor is connected with a source of a second driving transistor; a gate of the second driving transistor is connected with a first terminal of the storage capacitor, a drain of the second driving transistor is connected with a source of a third driving transistor; a gate of the third driving transistor is connected with the driving control line, a drain of the third driving transistor is connected with the light emitting module; a drain of a fourth driving transistor is connected with the drain of the second driving transistor, a source of the fourth driving transistor is connected with the first terminal of the storage capacitor; a second terminal of the storage capacitor is grounded;

a gate of the fourth driving transistor in the first driving module is connected with the first writing control line, and a gate of the fourth driving transistor in the second driving module is connected with the second writing control line.

9. The pixel circuit of claim 8, wherein it further comprises a first reset transistor and a second reset transistor, gates of both of the reset transistors are connected with a reset control line; a source of the first reset transistor is connected with the first terminal of the storage capacitor in the first driving module, a drain of the first reset transistor is connected with the second terminal of the storage capacitor in the first driving module; a source of the second reset transistor is connected with the first terminal of the storage capacitor in the second driving module, a drain of the second reset transistor is connected with the second terminal of the storage capacitor in the second driving module.

10. The pixel circuit of claim 8, wherein the transistors are P channel thin film transistors.

11. The pixel circuit of claim 3, wherein the transistors are P channel thin film transistors.

12. The pixel circuit of claim 3, wherein each of the driving modules comprises four driving transistors and a storage capacitor, a gate of a first driving transistor is connected with a first driving control line, a source of the first driving transistor is connected with drains of a second driving transistor and a third driving transistor, a drain of the first driving transistor is connected with the operating voltage line; a gate of the second driving transistor is connected with a second driving control line, a source of the second driving transistor is connected with a first terminal of the storage capacitor; a gate of the third driving transistor is connected with the first terminal of the storage capacitor, a source of the third driving transistor is connected with the light emitting module; a gate and a drain of a fourth driving transistor are connected with the first terminal of the storage capacitor, a source of the fourth driving transistor is connected with the corresponding writing transistor; and a second terminal of the storage capacitor is connected with a low voltage level line.

13. The pixel circuit of claim 12, wherein the transistors are N channel thin film transistors.

14. The pixel circuit of claim 1, wherein the data voltage writing module comprises three writing transistors; a gate of a first writing transistor is connected with the first writing control line, a source of the first writing transistor is connected with the data voltage line, a drain of the first writing transistor is connected with a source of a second writing transistor; a gate of the second writing transistor is connected with the first driving module and a drain of a third writing transistor, a drain of the second writing transistor is connected with a source of the third writing transistor and the second driving module; and a gate of the third writing transistor is connected with the second writing control line.

15. The pixel circuit of claim 14, wherein each of the driving modules comprises two driving transistors and a storage capacitor, wherein a source of a first driving transistor is connected with the operating voltage line, a drain of the first driving transistor is connected with a source of a second driving transistor; a gate of the second driving transistor is connected with the driving control line, a source of the second driving transistor is connected with the drain of the first driving transistor, a drain of the second driving transistor is connected with the light emitting module; the storage capacitor is connected between a gate and the source of the first driving transistor;

the gate of the first driving transistor in the first driving module is connected with the gate of the second writing transistor, and the gate of the first driving transistor in the second driving module is connected with the drain of the second writing transistor.

16. The pixel circuit of claim 15, wherein it further comprises a reset transistor, a gate of the reset transistor is connected with a reset control line, a source of the reset transistor is connected with the drain of the second writing transistor, and a drain of the reset transistor is connected with a reset low voltage level line.

17. A method for driving the pixel circuit of claim 1, with a process for driving each frame of pixel data comprising a first charging phase, a second charging phase and a light emitting phase, wherein the method comprises:

in the first charging phase, a first data voltage is applied on the data voltage line, and a first scan voltage is applied on the first writing control line so as to write the first data voltage into the first driving module;

in the second charging phase, a second data voltage is applied on the data voltage line, and a second scan voltage is applied on the second writing control line so as to write the second data voltage into the second driving module; and in the light emitting phase, a scan voltage is input to the driving control line to make the driving module drive the light emitting module to emit light.

18. A display apparatus comprising the pixel circuits of any one of claim 1.

19. A pixel circuit comprising a data voltage writing module, two driving modules and two light emitting modules; wherein the data voltage writing module is connected with a data voltage line, two writing control lines and the two driving modules of the two pixels respectively, and is configured to write a first data voltage of a first pixel of the two pixels on the data voltage line to a first driving module according to input from a first writing control line among the two writing control line at first and then write a second data voltage of a second pixel of the two pixels on the data voltage line to a second driving module according to input from a second writing control line among the two writing control line in a same frame; the first driving module is connected with a first light emitting module, the second driving module is connected with a second light emitting module; and both of the two driving modules are connected with an operating voltage line and a driving control line, and are configured to drive the corresponding light emitting module to emit light under the control of the driving control line;

wherein each of the sub-data voltage writing modules comprises a writing transistor, a gate of the writing transistor is connected with the corresponding writing control line, a source of the writing transistor is connected with the data voltage line, and a drain of the writing transistor is connected with the corresponding driving module;

wherein each of the driving modules comprises four driving transistors and a storage capacitor; wherein a gate of a first driving transistor is connected with the driving control line, a source of the first driving transistor is connected with an operating voltage line, a drain of the first driving transistor is connected with a source of a second driving transistor; a gate of the second driving transistor is connected with a first terminal of the storage capacitor, a drain of the second driving transistor is connected with a source of a third driving transistor; a gate of the third driving transistor is connected with the driving control line, a drain of the third driving transistor is connected with the light emitting module; a drain of a fourth driving transistor is connected with the drain of the second driving transistor, a source of the fourth driving transistor is connected with the first terminal of the storage capacitor; a second terminal of the storage capacitor is grounded;

a gate of the fourth driving transistor in the first driving module is connected with the first writing control line, and a gate of the fourth driving transistor in the second driving module is connected with the second writing control line;

wherein the pixel circuit further comprises a first reset transistor and a second reset transistor, gates of both of the reset transistors are connected with a reset control line; a source of the first reset transistor is connected with the first terminal of the storage capacitor in the first driving module, a drain of the first reset transistor is connected with the second terminal of the storage capacitor in the first driving module; a source of the second reset transistor is connected with the first terminal of the storage capacitor in the second driving module, a drain of the second reset transistor is connected with the second terminal of the storage capacitor in the second driving module;

wherein the pixel circuit further comprises a capacitive touch detection module and a photo-sensitive touch detection module;

the capacitive touch detection module comprises a first touch transistor, a second touch transistor, a third touch transistor, a first sensing capacitor and a touch electrode, a gate of the first touch transistor is connected with the reset control line, a source of the first touch transistor is connected with the data voltage line, a drain of the first touch transistor is connected with a first terminal of the first sensing capacitor; a gate of the second touch transistor is connected with the first terminal of the first sensing capacitor, a source of the second touch transistor is connected with a second terminal of the first sensing capacitor, a drain of the second touch transistor is connected with a source of the third touch transistor; a gate of the third touch transistor is connected with the first writing control line, a drain of the third touch transistor is connected with a touch signal reading line; the second terminal of the first sensing capacitor is further connected with a detect driving voltage line, and the touch electrode is connected with the gate of the second touch transistor;

the photo-sensitive touch detection module comprises a fourth touch transistor, a fifth touch transistor, a sixth touch transistor, a seventh touch transistor and a second sensing capacitor, a gate of the fourth touch transistor is connected with the second writing control line, a source of the fourth touch transistor is connected with the data voltage line, a drain of the fourth touch transistor is connected with a first terminal of the second sensing capacitor; a gate and a drain of the fifth touch transistor are connected with the first terminal of the second sensing capacitor, a source of the fifth touch transistor is connected with a second terminal of the second sensing capacitor; a gate of the sixth touch transistor is connected with the driving control line, a source of the sixth touch transistor is connected with the second terminal of the second sensing capacitor, a drain of the sixth touch transistor is connected with the touch signal reading line; a gate of the seventh touch transistor is connected with the reset control line, a source of the seventh touch transistor is connected with the first terminal of the second sensing capacitor, a drain of the seventh touch transistor is grounded; wherein the fifth touch transistor is a photo-sensitive transistor.

20. The pixel circuit of claim 19, wherein the remaining transistors except for the fifth touch transistor among the transistors are P channel thin film transistors and the fifth touch transistor is a N channel thin film transistor.

* * * * *